United States Patent
Kataoka et al.

(10) Patent No.: US 11,892,768 B2
(45) Date of Patent: Feb. 6, 2024

(54) REFLECTIVE MASK BLANK, REFLECTIVE MASK AND METHOD OF MANUFACTURING THE SAME, AND METHOD OF MANUFACTURING SEMICONDUCTOR DEVICE

(71) Applicant: HOYA CORPORATION, Tokyo (JP)

(72) Inventors: Mizuki Kataoka, Tokyo (JP); Yohei Ikebe, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 284 days.

(21) Appl. No.: 17/265,990

(22) PCT Filed: Aug. 8, 2019

(86) PCT No.: PCT/JP2019/031361
§ 371 (c)(1),
(2) Date: Feb. 4, 2021

(87) PCT Pub. No.: WO2020/045029
PCT Pub. Date: Mar. 5, 2020

(65) Prior Publication Data
US 2021/0311382 A1 Oct. 7, 2021

(30) Foreign Application Priority Data
Aug. 29, 2018 (JP) ................. 2018-159970

(51) Int. Cl.
*G03F 1/24* (2012.01)
*G03F 1/54* (2012.01)

(52) U.S. Cl.
CPC . *G03F 1/24* (2013.01); *G03F 1/54* (2013.01)

(58) Field of Classification Search
CPC ................. G03F 1/24; G03F 1/54; G03F 1/58
See application file for complete search history.

(56) References Cited

U.S. PATENT DOCUMENTS

| 7,981,573 B2* | 7/2011 | Ishibashi | ............... B82Y 10/00 430/5 |
| 2002/0115000 A1 | 8/2002 | Gupta et al. | |

(Continued)

FOREIGN PATENT DOCUMENTS

| EP | 2317382 B1 * | 10/2016 | ............. B82Y 10/00 |
| JP | H0669185 A | 3/1994 | |

(Continued)

OTHER PUBLICATIONS

SG11202101338U, "Invitation to Respond to Written Opinion", dated May 5, 2022, 6 pages.

(Continued)

*Primary Examiner* — Mark F. Huff
*Assistant Examiner* — Moriah S. Smoot
(74) *Attorney, Agent, or Firm* — Kilpatrick Townsend & Stockton LLP

(57) ABSTRACT

Provided is a reflective mask blank that can reduce the shadowing effect of a reflective mask and form a fine and high-precision absorbent body pattern.
The reflective mask blank comprises a substrate, a multi-layer reflective film disposed on the substrate, and an absorbent body film disposed on the multi-layer reflective film, and is characterized in that: the absorbent body film includes, in at least a part thereof, at least one element with a high absorption coefficient, chosen from the group consisting of cobalt (Co) and nickel (Ni), and an element that increases the speed of dry etching; the absorbent body film includes a lower-surface region that includes a surface on the substrate side and an upper-surface region that includes a surface on the side opposite the substrate; and the concentration (atomic percentage) of the element with the high absorption coefficient in the upper-surface region is greater (Continued)

than the concentration (atomic percentage) of the element with the high absorption coefficient in the lower-surface region.

25 Claims, 3 Drawing Sheets

(56) References Cited

U.S. PATENT DOCUMENTS

| | | | |
|---|---|---|---|
| 2005/0106474 A1* | 5/2005 | Kindt | G03F 1/24 |
| | | | 205/82 |
| 2005/0238963 A1 | 10/2005 | Ishibashi et al. | |
| 2006/0222961 A1 | 10/2006 | Yan | |
| 2009/0214961 A1* | 8/2009 | Nozawa | G03F 1/46 |
| | | | 430/5 |
| 2014/0051015 A1* | 2/2014 | Gallagher | G03F 1/24 |
| | | | 430/5 |
| 2016/0223896 A1 | 8/2016 | Sun et al. | |
| 2019/0265585 A1 | 8/2019 | Ikebe et al. | |
| 2019/0369483 A1 | 12/2019 | Ikebe et al. | |

FOREIGN PATENT DOCUMENTS

| | | | | |
|---|---|---|---|---|
| JP | 2002261005 A | 9/2002 | | |
| JP | 2002299227 A | 10/2002 | | |
| JP | 2004039884 A | 2/2004 | | |
| JP | 2004207593 A | 7/2004 | | |
| JP | 2008535270 A | 8/2008 | | |
| JP | 2010080659 A | 4/2010 | | |
| JP | 2015225280 A | 12/2015 | | |
| KR | 20170021191 A * | 2/2017 | | |
| WO | WO-2018022372 A1 * | 2/2018 | | G03F 1/24 |
| WO | 2018074512 A1 | 4/2018 | | |
| WO | 2018135468 A1 | 7/2018 | | |
| WO | WO-2018159785 A1 * | 9/2018 | | G03F 1/22 |

OTHER PUBLICATIONS

JP2018-159970, "Notice of Reasons for Refusal with Machine Translation", dated Apr. 26, 2022, 9 pages.
TW108130563, "Office Action", dated Feb. 8, 2023, 8 pages.
SG11202101338U, "Office Action", dated Oct. 9, 2023, 9 pages.
PCT/JP2019/031361, English translation of International Search Report, dated Oct. 15, 2019, 2 pages.
JP2018-159970, "Decision of Refusal" with Machine Translation, dated Oct. 25, 2022, 11 pages.
TW108130563, "Decision of Rejection", dated Oct. 19, 2023, 4 pages.

* cited by examiner

REFLECTIVE MASK BLANK, REFLECTIVE MASK AND METHOD OF MANUFACTURING THE SAME, AND METHOD OF MANUFACTURING SEMICONDUCTOR DEVICE

CROSS-REFERENCE TO RELATED APPLICATIONS

This application is a National Stage of International Application No. PCT/JP2019/031361, filed Aug. 8, 2019, which claims priority to Japanese Patent Application No. 2018-159970, filed Aug. 29, 2018, and the contents of which are incorporated by reference.

TECHNICAL FIELD

The present disclosure relates to a reflective mask used for manufacturing a semiconductor device and the like, and a reflective mask blank used for manufacturing the reflective mask. The present disclosure also relates to a method of manufacturing a semiconductor device using the above reflective mask.

BACKGROUND ART

The wavelengths of light sources of exposure apparatuses in manufacturing semiconductor devices have been gradually shortened. Specifically, the wavelength of the light source has been gradually shortened to 436 nm (g line), 365 nm (i line), 248 nm (KrF laser), and 193 nm (ArF laser). In order to achieve further finer pattern transfer, extreme ultra violet (EUV) lithography using EUV having a wavelength in the neighborhood of 13.5 nm has been developed. Since there are few materials transparent to EUV light a reflective mask is used in EUV lithography. The reflective mask has, as a basic structure, a mask structure including a multilayer reflective film that is formed on a low thermal expansion substrate and is for reflecting exposure light, a protective film that is formed on the multilayer reflective film and is for protecting the multilayer reflective film, and a desired transfer pattern formed on the protective film. Additionally, as a typical reflective mask, there are a binary-type reflective mask and a phase shift-type reflective mask (halftone phase shift-type reflective mask). The binary-type reflective mask has a relatively thick absorber pattern (pattern for transfer) that sufficiently absorbs EUV light. The phase shift-type reflective mask has a relatively thin absorber pattern (phase shift pattern) that reduces EUV light by light absorption and generates reflected light having a phase substantially inverted (phase inverted by approximately 180 degrees) with respect to reflected light from the multilayer reflective film. With this phase shift-type reflective mask, high transfer optical image contrast can be obtained due to a phase shift effect, as with a transmission type optical phase shift mask. Therefore, the phase shift-type reflective mask has a resolution improving effect. Additionally, since the film thickness of the absorber pattern (phase shift pattern) of the phase shift-type reflective mask is small, a highly accurate and fine phase shift pattern can be formed.

In EUV lithography, a projection optical system including a large number of reflecting mirrors is used due to light transmittance. In the projection optical system, EUV light is made obliquely incident on the reflective mask to cause these reflecting mirrors not to block projection light (exposure light). Currently, the angle of incidence of exposure light on a reflective mask is mainly six degrees with respect to a vertical plane of a reflective mask substrate. Along with the improvement of a numerical aperture (NA) of the projection optical system, studies are being conducted toward achieving an incident angle that is more oblique (specifically, about eight degrees).

Since in EUV lithography, the exposure light is obliquely incident with respect to the reflective mask, there is an inherent problem called a shadowing effect. The shadowing effect is a phenomenon in which exposure light is obliquely incident on an absorber pattern having a three-dimensional structure, whereby a shadow is formed, resulting in changing the dimension and/or position of a pattern to be transferred and formed. The three-dimensional structure of the absorber pattern serves as a wall and a shadow is formed on a shade side, resulting in changing the dimension and/or the position of the pattern to be transferred and formed. For example, there are differences in the dimension and position of a transfer pattern between a case where the orientation of the absorber pattern to be arranged is parallel to a direction of obliquely incident light and a case where the orientation of the absorber pattern to be arranged is perpendicular to the direction of the obliquely incident light, and as a result, transfer accuracy decreases.

Patent Literatures 1 to 3 disclose techniques related to such a reflective mask for EUV lithography and a mask blank for manufacturing the same. Additionally, Patent Literature 1 also discloses a shadowing effect. Conventionally, the film thickness of the phase shift pattern is made relatively thin as compared with the case of the binary-type reflective mask, by using the phase shift-type reflective mask as the reflective mask for EUV lithography, whereby a decrease in the transfer accuracy due to the shadowing effect is reduced.

CITATION LIST

Patent Literature

Patent Literature 1: JP 2010-080659 A
Patent Literature 2: JP 2004-207593 A
Patent Literature 3: JP 2004-39884 A

Disclosure of the Disclosure

As the pattern is made finer and the accuracy of a pattern dimension and a pattern position is more improved, the electrical characteristics and performance of the semiconductor device are improved, a degree of integration can be improved, and a chip size can be reduced. Therefore, EUV lithography is required to have performance of transferring dimension patterns that are more accurate and finer by one step than conventional ones. It is presently required to form an ultra-fine and highly accurate pattern for half pitch 16 nm (hp 16 nm) generation. In response to such a requirement, a further reduction in the film thickness of an absorber film (phase shift film) is required in order to reduce the shadowing effect. In particular, in the case of EUV exposure, the film thickness of the absorber film (phase shift film) is required to be less than 60 nm, and preferably 50 nm or less.

As disclosed in Patent Literatures 1 to 3, Ta has been conventionally used as a material for forming the absorber film (phase shift film) of the reflective mask blank. However, a refractive index n of Ta in EUV light (for example, having a wavelength of 13.5 nm) is approximately 0.943. Therefore, even if a phase shift effect of Ta is used, the film thickness of an absorber film (phase shift film) formed of Ta alone is thinned to 60 nm that is the lowest limit. A metal material having a high extinction coefficient k (high absorption coefficient) is used as an absorber film of a binary-type reflective mask blank, whereby the absorber film can be thinned. Examples of a metal material having a large extinction coefficient k at a wavelength of 13.5 nm include cobalt (Co) and nickel (Ni).

In order to transfer and form a fine pattern, the absorber pattern of the reflective mask is required to have a cross-sectional shape close to vertical. However, Co and Ni having a large extinction coefficient k are materials that are difficult to etch and require a long etching time. Therefore, it is difficult to make the cross-sectional shape of the absorber pattern including Co and Ni vertical. That is, in a case where the absorber film is patterned by dry etching, the etching of a side wall at a lower part of the absorber pattern does not sufficiently proceed when an etching gas reaches the lower surface of the absorber film. Therefore, the cross-sectional shape of the absorber pattern becomes a sloped and tapered shape having a wide lower portion. Additional etching (over-etching) is required to ensure that the lower sidewall of the absorber pattern is etched.

However, if over-etching time is increased in order to remove a tapered shape portion of the cross section of the absorber pattern, an upper side wall of the absorber pattern is also etched. Therefore, it is difficult to make the cross-sectional shape of the absorber pattern vertical. In a case where a reflective mask having an absorber pattern having a tapered cross-sectional shape is used, there arises a problem that the accuracy of the transfer pattern formed on a transfer-receiving substrate is lowered. Additionally, if the over-etching is made too long, damage may occur to the protective film and/or the multilayer reflective film arranged on the substrate side of the absorber film.

In view of the above points, it is an aspect of the present disclosure to provide a reflective mask blank capable of reducing a shadowing effect of a reflective mask and forming a fine and highly accurate absorber pattern. Specifically, a purpose of the present disclosure is to provide a reflective mask blank capable of preventing a cross-sectional shape of an absorber pattern of the reflective mask from becoming a tapered shape when the absorber pattern is formed. Another aspect of the present disclosure is to provide a reflective mask and a method of manufacturing the reflective mask, which are capable of reducing the shadowing effect and preventing the cross-sectional shape of the absorber pattern from becoming a tapered shape. Another aspect of the present disclosure is to provide a method of manufacturing a semiconductor device using the reflective mask.

In order to solve the above problems, the present disclosure has the following configurations.

(Configuration 1)

A configuration 1 of the present disclosure is a reflective mask blank having a substrate, a multilayer reflective film provided on the substrate, and an absorber film provided on the multilayer reflective film, in which the absorber film includes at least one high absorption coefficient element selected from a group consisting of cobalt (Co) and nickel (Ni) and an element that increases a dry etching rate in at least a part of the absorber film, the absorber film includes a lower surface region including a surface on a side of the substrate and an upper surface region including a surface on a side opposite to the substrate, and a concentration (atomic %) of the high absorption coefficient element in the upper surface region is higher than a concentration (atomic %) of the high absorption coefficient element in the lower surface region.

(Configuration 2)

A configuration 2 of the present disclosure is the reflective mask blank according to the configuration 1 in which a concentration (atomic %) of the element that increases the dry etching rate in the lower surface region is higher than a concentration (atomic %) of the element that increases the dry etching rate in the upper surface region.

(Configuration 3)

A configuration 3 of the present disclosure is the reflective mask blank according to the configuration 1 or 2 in which the element that increases the dry etching rate is at least one element selected from a group consisting of tantalum (Ta), tungsten (W), and tin (Sn).

(Configuration 4)

A configuration 4 of the present disclosure is the reflective mask blank according to any one of configurations 1 to 3 in which the absorber film is a layered film including a lower layer including the lower surface region and an upper layer including the upper surface region, and when a concentration (atomic %) of the high absorption coefficient element that is included in a material of the lower layer is $C1_{lower}$ and a concentration (atomic %) of the high absorption coefficient element that is included in a material of the upper layer is $C1_{upper}$, the following formula holds:

$$C1_{upper} > C1_{lower} \geq 0 \qquad \text{(Formula 1)}$$

(Configuration 5)

A configuration 5 of the present disclosure is the reflective mask blank according to the configuration 4, in which when a concentration (atomic %) of the element that is included in the material of the lower layer and increases the dry etching rate is $C2_{lower}$, and a concentration (atomic %) of the element that is included in the material of the upper layer and increases the dry etching rate is $C2_{upper}$, the following formula holds:

$$C2_{lower} > C2_{upper} \geq 0 \qquad \text{(Formula 2)}.$$

(Configuration 6)

A configuration 6 of the present disclosure is the reflective mask blank according to the configuration 4 or 5, in which the material of the upper layer includes cobalt (Co) and tantalum (Ta), and the material of the lower layer includes tantalum (Ta).

(Configuration 7)

A configuration 7 of the present disclosure is the reflective mask blank according to the configuration 4 or 5, in which the material of the upper layer includes nickel (Ni) and tantalum (Ta), and the material of the lower layer includes tantalum (Ta).

(Configuration 8)

A configuration 8 of the present disclosure is the reflective mask blank according to any one of the configurations 4 to 7, in which the upper layer includes a material that is etchable by a dry etching gas including a first chlorine-based gas, and the lower layer includes a material that is etchable by a dry etching gas including a second chlorine-based gas different from the first chlorine-based gas.

(Configuration 9)

A configuration 9 of the present disclosure is the reflective mask blank according to any one of the configurations 1 to 8, in which a protective film is provided between the multilayer reflective film and the absorber film.

(Configuration 10)

A configuration 10 of the present disclosure is the reflective mask blank according to the configuration 9, in which an etching stopper film is provided between the protective film and the absorber film, and the etching stopper film includes a material including chromium (Cr) or a material including silicon (Si).

(Configuration 11)

A configuration 11 of the present disclosure is the reflective mask blank according to any one of the configurations 1 to 10, in which an etching mask film is provided on the absorber film, and the etching mask film includes a material including chromium (Cr) or a material including silicon (Si).

(Configuration 12)

A configuration 12 of the present disclosure is a reflective mask having an absorber pattern that is the absorber film with patterned in the reflective mask blank according to any one of the configurations 1 to 11 is patterned.

(Configuration 13)

A configuration 13 of the present disclosure is a method of manufacturing a reflective mask in which the absorber film of the reflective mask blank according to any one of the configurations 1 to 11 is patterned by dry etching using a chlorine-based gas to form an absorber pattern.

(Configuration 14)

A configuration 14 of the present disclosure is a method of manufacturing a reflective mask in which the absorber film of the reflective mask blank according to any one of the configurations 1 to 11 is patterned by dry etching using a first chlorine-based gas and a second chlorine-based gas different from the first chlorine-based gas to form an absorber pattern.

(Configuration 15)

A configuration 15 of the present disclosure is a method of manufacturing a semiconductor device that includes a step of setting the reflective mask of the configuration 12 in an exposure apparatus having an exposure light source that emits EUV light and transferring a transfer pattern to a resist film formed on a transfer-receiving substrate.

According to the present disclosure, it is possible to provide a reflective mask blank capable of reducing a shadowing effect of a reflective mask and forming a fine and highly accurate absorber pattern. Specifically, according to the present disclosure, it is possible to provide a reflective mask blank capable of preventing a cross-sectional shape of an absorber pattern of a reflective mask from becoming a tapered shape when the absorber pattern is formed. Additionally, according to the present disclosure, it is possible to provide a reflective mask capable of reducing a shadowing effect and preventing a cross-sectional shape of an absorber pattern from becoming a tapered shape, and a method of manufacturing the reflective mask. Additionally, it is possible to provide a method of manufacturing a semiconductor device using the reflective mask.

DESCRIPTION OF EMBODIMENTS

Figure 1:
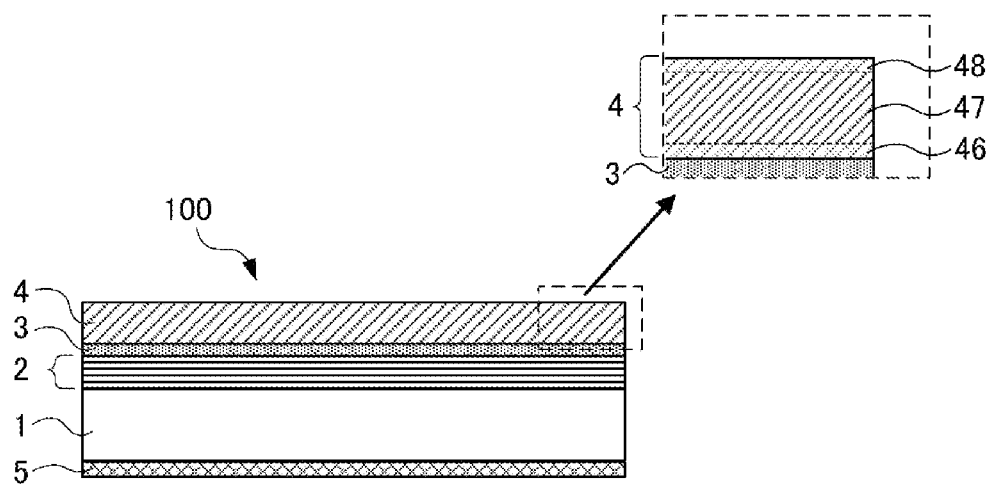
FIG. 1 is a schematic diagram for describing a configuration of one embodiment of a reflective mask blank of the present disclosure, and is a schematic cross-sectional diagram of a main part for describing a structure of an absorber film.

Hereinafter, embodiments of the present disclosure will be specifically described with reference to the drawings. Note that each of the following embodiments is one mode for embodying the present disclosure and does not limit the present disclosure within the scope thereof. Note that in the drawings, the same or corresponding parts are denoted by the same reference signs, and description thereof may be simplified or omitted.

<Configuration of Reflective Mask Blank 100 and Method of Manufacturing the Same>

FIG. 1 is a schematic cross-sectional diagram of a main part for describing an embodiment of a reflective mask blank 100 of the present embodiment. As shown in FIG. 1, in the present embodiment, the reflective mask blank 100 has a multilayer reflective film 2 and an absorber film 4 on a substrate 1 in this order. The multilayer reflective film 2 is formed on a side of a first main surface (front surface) of the substrate 1 and reflects EUV light that is exposure light. The absorber film 4 absorbs EUV light. In the present specification, a region of the absorber film 4 including a surface on a side of the substrate 1 is referred to as a lower surface region 46. Additionally, in the present specification, a region of the absorber film 4 including a surface on a side opposite to the substrate 1 is referred to as an upper surface region 48. Additionally, in the present specification, an element having a high absorption coefficient (extinction coefficient) with respect to predetermined EUV exposure light (for example, EUV light having a wavelength of 13.5 nm) is referred to as a high absorption coefficient element. The present embodiment is characterized in that a concentration (atomic %) of the high absorption coefficient element in the upper surface region 48 is higher than a concentration (atomic %) of the high absorption coefficient element in the lower surface region 46.

The reflective mask blank 100 of an embodiment shown in FIG. 1 further has a protective film 3 between the multilayer reflective film 2 and the absorber film 4. The protective film 3 is formed of a material having resistance to an etchant and a cleaning liquid when the absorber film 4 is patterned. The reflective mask blank 100 of the embodiment shown in FIG. 1 has a conductive back film 5 for an electrostatic chuck on a side of a second main surface (back surface) of the substrate 1.

Figure 4:
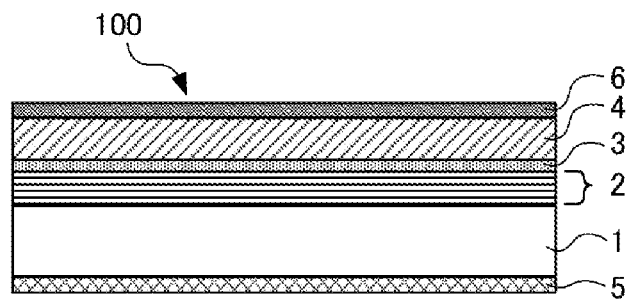
FIG. 4 is a schematic cross-sectional diagram of a main part showing an example of another embodiment of the reflective mask blank of the present disclosure.

FIG. 4 is a schematic cross-sectional diagram of a main part showing another embodiment of the reflective mask blank 100 of the present embodiment. Similarly to the reflective mask blank 100 shown in FIG. 1, a reflective mask blank 100 includes a substrate 1, a multilayer reflective film 2, a protective film 3, an absorber film 4, and a conductive back film 5. The reflective mask blank 100 shown in FIG. 4 further has an etching mask film 6, which becomes an etching mask for the absorber film 4 when the absorber film 4 is etched, on the absorber film 4. Note that in a case where the reflective mask blank 100 having the etching mask film 6 is used, the etching mask film 6 may be peeled off after a transfer pattern is formed on the absorber film 4 as described later.

Figure 5:
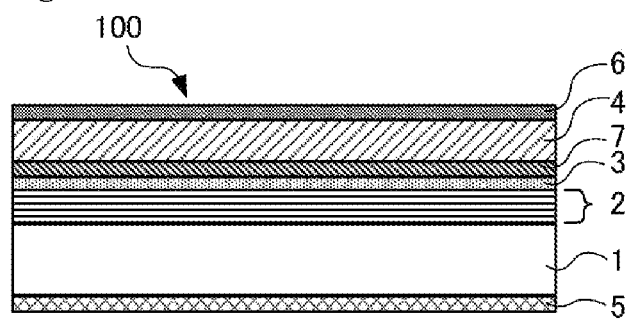
FIG. 5 is a schematic cross-sectional diagram of a main part showing an example of still another embodiment of the reflective mask blank of the present disclosure.

FIG. 5 is a schematic cross-sectional diagram of a main part showing still another embodiment of the reflective mask blank 100 of the present embodiment. Similarly to the reflective mask blank 100 shown in FIG. 4, a reflective mask blank 100 includes a substrate 1, a multilayer reflective film 2, a protective film 3, an absorber film 4, an etching mask film 6, and a conductive back film 5. The reflective mask blank 100 shown in FIG. 5 further has an etching stopper film 7, which serves as an etching stopper when the absorber film 4 is etched, between the protective film 3 and the absorber film 4. Note that in a case where the reflective mask blank 100 having the etching mask film 6 and the etching stopper film 7 is used, the etching mask film 6 and the etching stopper film 7 may be peeled off after a transfer pattern is formed on the absorber film 4 as described later.

Additionally, the reflective mask blank 100 includes a configuration in which the conductive back film 5 is not formed. Furthermore, the reflective mask blank 100 includes a configuration of a mask blank with a resist film in which a resist film 11 is formed on the absorber film 4 or the etching mask film 6.

In the present specification, for example, the description of "the multilayer reflective film 2 formed on a main surface of the substrate 1" means that the multilayer reflective film 2 is arranged in contact with a surface of the substrate 1 and also means that that another film is provided between the substrate 1 and the multilayer reflective film 2. The same applies to other films. Additionally, in the present specification, for example, the expression of "a film A is arranged on a film B while the film A is in contact with the film B" means that the film A and the film B are arranged in direct contact with each other without another film interposed between the film A and the film B.

Hereinafter, each configuration of the reflective mask blank 100 will be specifically described.

<<Substrate 1>>

As the substrate 1, a substrate having a low thermal expansion coefficient in the range of 0±5 ppb/° C. is preferably used in order to prevent distortion of an absorber pattern 4a due to heat at the time of exposure to EUV light. As a material having a low thermal expansion coefficient in this range, for example, $SiO_2$—$TiO_2$-based glass or multi-component glass ceramics can be used.

In view of obtaining at least pattern transfer accuracy and position accuracy, a first main surface on a side of the substrate 1 where a transfer pattern (constituted by the absorber film 4 to be described later) is formed has been subjected to a surface treatment so that the first main surface has high flatness. In the case of EUV exposure, flatness in an area of 132 mm×132 mm of the main surface on the side of the substrate 1 where the transfer pattern is formed is preferably 0.1 μm or less, more preferably 0.05 μm or less, and particularly preferably 0.03 μm or less. The second main surface on a side opposite to the side on which the absorber film 4 is formed is the surface (back surface) that is electrostatically chucked when the reflective mask 100 is set in an exposure apparatus. Flatness in an area having a size of 132 mm×132 mm of the back surface is preferably 0.1 μm or less, more preferably 0.05 μm or less, and particularly preferably 0.03 μm or less. Note that flatness in an area of 142 mm×142 mm on the side of the second main surface (back surface) in the reflective mask blank 100 is preferably 1 μm or less, more preferably 0.5 μm or less, and particularly preferably 0.3 μm or less.

Additionally, height of surface smoothness of the substrate 1 is also an extremely important item. Surface roughness of the first main surface of the substrate 1 on which the absorber pattern 4a is formed is preferably a root mean square roughness (RMS) of 0.1 nm or less. Note that the surface smoothness can be measured with an atomic force microscope.

Furthermore, the substrate 1 has preferably high rigidity in order to prevent deformation due to film stress of a film (such as the multilayer reflective film 2) formed on the substrate 1. In particular, the substrate 1 has preferably a high Young's modulus of 65 GPa or more.

<<Multilayer Reflective Film 2>>

The multilayer reflective film 2 provides a reflective mask 200 with a function that reflects EUV light. The reflective mask 200 has a configuration of a multilayer film in which layers mainly containing elements having different refractive indexes are periodically layered.

Generally, as the multilayer reflective film 2, there is used a multilayer film in which a thin film (high refractive index layer) of a light element that is a high refractive index material or a compound of the light element and a thin film (low refractive index layer) of a heavy element that is a low refractive index material or a compound of the heavy element are alternately layered for about 40 to 60 periods. The multilayer film may be formed by counting, as one period, a stack of a high refractive index layer and a low refractive index layer in which the high refractive index layer and the low refractive index layer are layered in this order from the substrate 1 and then by building up the stack for a plurality of periods. Additionally, the multilayer film may be formed by counting, as one period, a stack of a low refractive index layer and a high refractive index layer in which the low refractive index layer and the high refractive index layer are layered in this order from the substrate 1 and by building up the stack for a plurality of periods. Note that a layer of the outermost surface of the multilayer reflective film 2, that is, a surface layer of the multilayer reflective film 2 on the side opposite to the substrate 1 is preferably a high refractive index layer. In a case where in the multilayer film described above, a stack of a high refractive index layer and a low refractive index layer in which the high refractive index layer and the low refractive index layer are layered in this order from the substrate 1 is counted as one period and the stack is built up for a plurality of periods, the uppermost layer is a low refractive index layer. In a case where the uppermost layer is the low refractive index layer, when the low refractive index layer constitutes the outermost surface of the multilayer reflective film 2, the uppermost layer is easily oxidized and the reflectance of the reflective mask 200 is reduced. Therefore, the multilayer reflective film 2 is preferably formed by further forming a high refractive index layer on the low refractive index layer that is the uppermost layer. Meanwhile, in a case where in the multilayer film described above, a stack of a low refractive index layer and a high refractive index layer in which the low refractive index layer and the high refractive index layer are layered in this order from the substrate 1 is counted as one period and the stack is built up for a plurality of periods, the uppermost layer is a high refractive index layer and this stack is good as is.

In the present embodiment, a layer including silicon (Si) is employed as the high refractive index layer. As a material including Si, a Si compound including boron (B), carbon (C), nitrogen (N), and oxygen (O) in Si may be used in addition to Si alone. The layer including Si is used as the high refractive index layer, whereby the multilayer reflective film 2 having high reflectance of EUV light can be obtained. In addition, in the present embodiment, a glass substrate is preferably used as the substrate 1. Si has excellent adhesion to the glass substrate. In addition, as the low refractive index layer, a metal alone selected from molybdenum (Mo), ruthenium (Ru), rhodium (Rh), and platinum (Pt), or an alloy thereof is used. For example, as the multilayer reflective film 2 for EUV light having a wavelength of 13 nm to 14 nm, a Mo/Si periodic layered film in which a Mo film and a Si film are alternately layered for about 40 to 60 periods is preferably used. Note that a high refractive index layer that is the uppermost layer of the multilayer reflective film 2 may be formed using silicon (Si), and a silicon oxide layer including silicon and oxygen may be formed between the uppermost layer (Si layer) and the Ru-based protective film 3. The silicon oxide layer is included on the uppermost layer, whereby mask cleaning resistance can be improved.

The reflectance of such a multilayer reflective film 2 alone is usually 65% or more, and an upper limit is usually 73%. Note that the thickness and period of each constituent layer of the multilayer reflective film 2 are appropriately selected according to an exposure wavelength and are selected so as to satisfy the Bragg reflection law. In the multilayer reflective film 2, there are a plurality of high refractive index layers and a plurality of low refractive index layers, but thickness does not need to be the same between the high refractive index layers and between the low refractive index layers. Additionally, the film thickness of the Si layer that is the outermost surface of the multilayer reflective film 2 can be adjusted within a range that does not lower the reflectance. The film thickness of the Si (high refractive index layer) of the outermost surface can be 3 nm to 10 nm.

A method of forming the multilayer reflective film 2 is publicly known in this technical field. For example, the multilayer reflective film 2 can be formed by forming a film of each layer in the multilayer reflective film 2 by an ion beam sputtering method. In the case of the above-mentioned Mo/Si periodic multilayer film, for example, a Si film having a thickness of about 4 nm is first formed on the substrate 1 using a Si target, for example, by the ion beam sputtering method. Then, a Mo film having a thickness of about 3 nm is formed using a Mo target. This formation is counted as one period and the Si film, and the Mo film are stacked for 40 to 60 periods to form the multilayer reflective film 2 (the outermost layer is the Si layer). In a case where the period of the multilayer reflective film 2 is 60 periods, the number of steps is larger than the number of steps in the case of 40 periods, but the reflectance for EUV light can be increased. Additionally, when the multilayer reflective film 2 is formed, the multilayer reflective film 2 is preferably formed by supplying krypton (Kr) ion particles from an ion source and performing ion beam sputtering.

<<Protective Film 3>>

The reflective mask blank 100 of the present embodiment preferably has the protective film 3 between the multilayer reflective film 2 and the absorber film 4. The protective film 3 is provided between the multilayer reflective film 2 and the absorber film 4, whereby it is possible to reduce damage to the surface of the multilayer reflective film 2 when the reflective mask 200 is manufactured using the reflective mask blank 100. Thus, the reflection characteristics of the reflective mask 200 with respect to EUV light are good.

The protective film 3 is formed on the multilayer reflective film 2 in order to protect the multilayer reflective film 2 from dry etching and cleaning in a step of manufacturing the reflective mask 200 to be described later. Additionally, the protective film 3 also serves to protect the multilayer reflective film 2 when a black defect of the absorber pattern 4a is repaired using an electron beam (EB). Here, FIG. 1 shows a case where the protective film 3 is one layer, but the protective film 3 can include a stack of three or more layers.

For example, the lowermost layer and the uppermost layer may be layers containing the substance containing Ru, and the protective film 3 may be one in which a metal or alloy other than Ru is interposed between the lowermost layer and the uppermost layer. A material of the protective film 3 includes, for example, a material including ruthenium as a main component. That is, the material of the protective film 3 may be a Ru metal alone or a Ru alloy containing at least one kind of a metal selected from titanium (Ti), niobium (Nb), molybdenum (Mo), zirconium (Zr), yttrium (Y), boron (B), lanthanum (La), cobalt (Co), rhenium (Re), and the like. Additionally, the material of the protective film 3 can be a material further including nitrogen in Ru or a Ru alloy. The protective film 3 of such a material is particularly effective in a case where the absorber film 4 is patterned by dry etching of a chlorine-based gas (Cl-based gas). The protective film 3 is preferably formed of a material having a high etching selective ratio of the absorber film 4 to the protective film 3 in dry etching using a chlorine-based gas (etching rate of the absorber film 4/etching rate of the protective film 3) that is 1.5 or more, and preferably 3 or more.

In a case where a Ru alloy is used as the material of the protective film 3, the Ru content of the Ru alloy is 50 atomic % or more and less than 100 atomic %, preferably 80 atomic % or more and less than 100 atomic %, and more preferably 95 atomic % or more and less than 100 atomic %. In particular, in a case where the Ru content of the Ru alloy is 95 atomic % or more and less than 100 atomic %, it is possible to combine the functions of the protective film 3 that are the mask cleaning resistance, an etching stopper function when the absorber film 4 is etched, and the prevention of a change of the multilayer reflective film 2 with time, while the diffusion of an element (for example, silicon) constituting the multilayer reflective film 2 into the protective film 3 is reduced and the reflectance of EUV light is sufficiently secured.

In EUV lithography, since there are few substances that are transparent to exposure light, it is not technically easy to achieve an EUV pellicle that prevents foreign matters from adhering to a mask pattern surface. For this reason, pellicle-less operation without using a pellicle has been the mainstream. Additionally, in the case of EUV lithography, exposure contamination such as carbon film deposition on a mask or an oxide film growth due to EUV exposure occurs. Therefore, it is necessary to frequently clean and remove foreign matters and contamination on a mask at a stage where the reflective mask 200 for EUV lithography is used for manufacturing a semiconductor device. For this reason, the reflective mask 200 is required to have extraordinary mask cleaning resistance as compared with a transmissive mask for optical lithography. The Ru-based protective film 3 containing Ti is used, whereby cleaning resistance to cleaning liquids such as sulfuric acid, sulfuric acid peroxide (SPM), ammonia, ammonia peroxide (APM), hydroxyl (OH) radical cleaning water, and ozone water having a concentration of 10 ppm or less becomes particularly high. Therefore, it is possible to satisfy the requirement of mask cleaning resistance.

The thickness of the protective film 3 is not particularly limited as long as the function of the protective film 3 can be achieved. The thickness of the protective film 3 is preferably 1.0 nm to 8.0 nm, and more preferably 1.5 nm to 6.0 nm from the viewpoint of the reflectance of EUV light.

As a method of forming the protective film 3, it is possible to adopt a film forming method similar to a publicly known one without any particular limitation. Specific examples include a sputtering method and an ion beam sputtering method.

<<Absorber Film 4>>

The absorber film 4 that absorbs EUV light is formed on the protective film 3. The absorber film 4 has a function of absorbing EUV light. The absorber film 4 is processed into a predetermined pattern by dry etching, whereby the absorber pattern 4a can be obtained.

A metal material having a high extinction coefficient k (high absorption coefficient) with respect to EUV light (for example, having a wavelength of 13.5 nm) is used, whereby the absorber film 4 of the present embodiment can be thinned. In the present specification, the metal element having a high extinction coefficient k (high absorption coefficient) is referred to as a "high absorption coefficient element". Specifically, the high absorption coefficient element means an element of Ta that has been conventionally used as a material for the absorber film 4 of the reflective mask and has an extinction coefficient larger than an extinction coefficient for EUV light having a wavelength of 13.5 nm. As the high absorption coefficient element that can be used as the absorber film 4 of the present embodiment, at least one selected from a group consisting of cobalt (Co) and nickel (Ni) can be used.

In the present specification, a value of the refractive index n of a predetermined material means the refractive index n with respect to EUV light (having a wavelength of 13.5 nm), and a value of the extinction coefficient k of a predetermined material means the extinction coefficient k with respect to EUV light (having a wavelength of 13.5 nm).

Conventionally, tantalum (Ta) is often used as the absorber film 4 of the reflective mask blank 100 because of good workability of Ta. Note that the refractive index n and the extinction coefficient k of tantalum (Ta) are n=0.943 and k=0.041, respectively. Meanwhile, the refractive index n and the extinction coefficient k of cobalt (Co) are n=0.933 and k=0.066, respectively. Additionally, the refractive index n and the extinction coefficient k of nickel (Ni) are n=0.948 and k=0.073, respectively. Thus, the extinction coefficients k of cobalt and nickel are larger than the extinction coefficient k of tantalum. Therefore, at least one high absorption coefficient element selected from the group consisting of cobalt (Co) and nickel (Ni) is used as the material of the absorber film 4, whereby the absorber film 4 can be thinned. As a result, a shadowing effect of the reflective mask 200 can be reduced.

Meanwhile, cobalt (Co) and nickel (Ni) are materials that are difficult to etch. When the etching takes a long time, a side wall at an upper part of the absorber pattern 4a is etched, whereby the cross-sectional shape of the absorber pattern 4a may become a tapered shape. In a case where the reflective mask 200 having the absorber pattern 4a having a tapered cross-sectional shape is used, there arises a problem that the accuracy of the transfer pattern formed on the transfer-receiving substrate 1 decreases.

Accordingly, the present inventors have found that when the absorber film 4 is etched, the etching rate at the final stage of etching is increased as compared with the initial stage of etching, whereby it is possible to reduce that the cross-sectional shape of the absorber pattern 4a becomes a tapered shape. Furthermore, the present inventors have found making a concentration (atomic %) of the high absorption coefficient element in the region (upper surface region 48) of the absorber film 4 including the surface on the side opposite to the substrate 1) higher than a concentration (atomic %) of the high absorption coefficient element in the region (lower surface region 46) of the absorber film 4 on the side of the substrate 1 in order to increase the etching rate at the final stage of etching. As a result, the present inventors have reached the present embodiment. Note that the lower surface region 46 does not have to include a high absorption coefficient element. That is, the concentration (atomic %) of the high absorption coefficient element in the lower surface region 46 can be zero.

Note that the lower surface region 46 includes an element other than the high absorption coefficient element. In order to increase the etching rate at the final stage of etching, the lower surface region 46 preferably includes an element that increases the dry etching rate. The element that increases the dry etching rate means an element with which, in a case where a predetermined etching gas is used to etch the high absorption coefficient element, an etching rate by the predetermined etching gas is faster than an etching rate in a case where the high absorption coefficient element is etched.

The lower surface region 46 and the upper surface region 48 of the absorber film 4 will be further described.

As shown in FIG. 1, the absorber film 4 includes the lower surface region 46 and the upper surface region 48. The lower surface region 46 is a region including a surface on the side of the substrate 1 among two surfaces (interfaces) of the absorber film 4. In an example shown in FIG. 1, the lower surface region 46 includes a surface (referred to as "lower surface" in the present specification) in contact with the protective film 3 among the surfaces (interfaces) of the absorber film 4 and is a region in the vicinity of the surface. Additionally, the upper surface region 48 is a region including a surface (referred to as "upper surface" in the present specification) on the side opposite to the substrate 1 among the two surfaces (interfaces) of the absorber film 4. In an example shown in FIG. 1, the upper surface region 48 includes the surface of the absorber film 4 that is the outermost surface of the reflective mask blank 100 and is a region in the vicinity of the surface. Both the lower surface region 46 and the upper surface region 48 are regions in the vicinity of the lower surface and the upper surface and can be regions having a depth of 10% and preferably 5% of the film thickness of the absorber film 4 from the lower surface or the upper surface. The lower surface region 46 and the upper surface region 48 are virtual regions for expressing the distribution of the concentration of the high absorption coefficient element (atomic %) and the concentration of the element that increases the dry etching rate (atomic %) in the absorber film 4. The concentration distribution of predetermined elements in the lower surface region 46 and the upper surface region 48 does not have to be uniform. Concentrations of the predetermined element in the lower surface region 46 and the upper surface region 48 can be each an average value of the concentration of the predetermined element in each region.

The concentration distribution of a predetermined element in a region between the lower surface region 46 and the upper surface region 48 (referred to as "intermediate region 47" in the present specification) is any distribution. The concentration distribution of the predetermined element in the intermediate region 47 is preferably distribution that monotonically decreases or monotonically increases in a depth direction. Specifically, the concentration of the high absorption coefficient element in the intermediate region 47 preferably decreases monotonically from the upper surface region 48 to the lower surface region 46 in the depth direction of the absorber film 4. Additionally, the concentration of the element that increases the dry etching rate in the intermediate region 47 preferably increases monotonically from the upper surface region 48 to the lower surface region 46 in the depth direction of the absorber film 4. The concentration of the predetermined element in the depth direction can change in an inclined manner and also can change (increase or decrease) in a stepwise manner. In the present specification, a monotonous decrease in the concentration of the element includes a stepwise decrease in the concentration of the element. In the present specification, a monotonous increase in the concentration of an element includes a stepwise increase in the concentration of the element.

In the absorber film 4 of the present embodiment, the concentration (atomic %) of the high absorption coefficient element in the lower surface region 46 is lower than the concentration (atomic %) of the high absorption coefficient element in the upper surface region 48. Therefore, when the absorber film 4 is etched, the etching rate of the lower surface region 46 at the final stage of etching can be increased. Specifically, the etching rate of the lower surface region 46 is preferably 1.5 times or more, and more preferably 3 times or more the etching rate of the upper surface region 48. Additionally, the etching rate of the lower surface region 46 is preferably 10 times or less, and more preferably 8 times or less the etching rate of the upper surface region 48. By adjusting the concentration of the high absorption coefficient element in the lower surface region 46 so that materials in the lower surface region 46 and the upper surface region 48 have such etching rates, it is possible to prevent the cross-sectional shape of the absorber pattern 4a from becoming a tapered shape. If the reflective mask blank of the present embodiment is used, since the tapered cross-sectional shape can be prevented, the reflective mask 200 having the fine and highly accurate absorber pattern 4a can be manufactured.

In the reflective mask blank 100 of the present embodiment, the concentration (atomic %) of the element that increases the dry etching rate of the lower surface region 46 is preferably higher than the concentration (atomic %) of the element that increases the dry etching rate of the upper surface region 48. The element that increases the dry etching rate is preferably at least one element selected from a group consisting of tantalum (Ta), tungsten (W), and tin (Sn). Additionally, as the element that increases the dry etching rate, nitrogen can be included in addition to a predetermined metal element. The lower surface region 46 includes more element that increases the dry etching rate, whereby it is possible to increase the etching rate at the final stage of etching the absorber film 4. As a result, it is possible to further ensure that the cross-sectional shape of the absorber pattern 4a is prevented from becoming a tapered shape.

Figure 2:
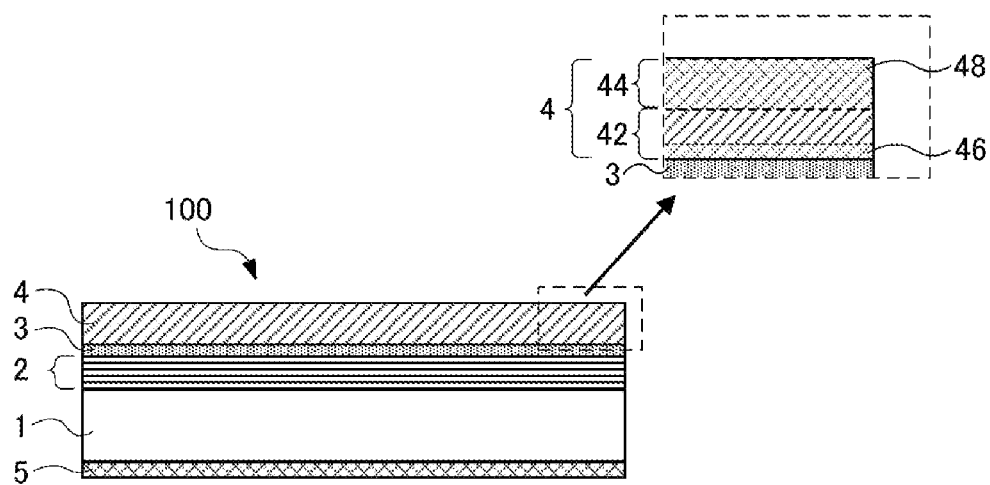
FIG. 2 is a schematic cross-sectional diagram of a main part for describing a schematic configuration of a reflective mask blank of the present disclosure.

As shown in FIG. 2, the absorber film 4 of the reflective mask blank 100 of another embodiment can be a layered film including a lower layer 42 including a lower surface region 46 and an upper layer 44 including an upper surface region 48.

As shown in FIG. 2, the absorber film 4 can include the lower layer 42 including the lower surface region 46 and the upper layer 44 including the upper surface region 48. In an example shown in FIG. 2, the absorber film 4 is a layered film including the lower layer 42 and the upper layer 44. The concentration distribution of the predetermined element of each of the lower layer 42 and the upper layer 44 is preferably substantially uniform. Additionally, in a case where the absorber film 4 is a layered film including the lower layer 42 and the upper layer 44, the concentrations of the predetermined elements in the lower surface region 46 and the lower layer 42 are the same, and concentrations of the predetermined elements in the upper surface region 48 and the upper layer 44 are the same.

In the example shown in FIG. 2, the layered film of the absorber film 4 is two layers, that is, the lower layer 42 and the upper layer 44. In the present embodiment, the absorber film 4 can be a layered film having three or more layers. The absorber film 4 of the reflective mask blank 100 of the present embodiment is preferably a layered film having two layers, that is, the lower layer 42 and the upper layer 44 from the viewpoint that a film forming process of the absorber film 4 can be simplified and a manufacturing cost can be reduced.

In the absorber film 4 of the reflective mask blank 100 of an embodiment shown in FIG. 2, when a concentration (atomic %) of the high absorption coefficient element that is included in a material of the lower layer 42 is set as $C1_{lower}$, and a concentration (atomic %) of the high absorption coefficient element that is included in a material of the upper layer 44 is $C1_{upper}$, the following relationship (Formula 1) is satisfied.

$$C1_{upper} > C1_{lower} \geq 0 \qquad \text{(Formula 1)}$$

According to the reflective mask blank 100 of the embodiment shown in FIG. 2, the absorber film 4 is a layered film including the lower layer 42 and the upper layer 44 each having the concentration of a predetermined high absorption coefficient element, whereby it is possible to increase the etching rate of the lower layer 42 of the absorber film 4 as compared with the etching rate of the upper layer 44. Therefore, when the absorber pattern 4a of the reflective mask 200 is formed, it is possible to prevent the cross-sectional shape of the pattern from becoming a tapered shape.

In the reflective mask blank 100 of the embodiment shown in FIG. 2, when the concentration (atomic %) of the element that is included in the material of the lower layer 42 and increases the dry etching rate is $C2_{lower}$, and the concentration (atomic %) of the element that is included in the material of the upper layer 44 and increases the dry etching rate is $C2_{upper}$, the following relationship (Formula 2) is preferably satisfied.

$$C2_{lower} > C2_{upper} \geq 0 \qquad \text{(Formula 2)}$$

The concentrations (atomic %) of the elements that increase the dry etching rates in the lower layer 42 and the upper layer 44 of the absorber film 4 are in a predetermined relationship, whereby it is possible to ensure that the etching rate of the lower layer 42 of the absorber film 4 is increased as compared with the etching rate of the upper layer 44. As a result, it is possible to further ensure that the cross-sectional shape of the absorber pattern 4a is prevented from becoming a tapered shape when the absorber pattern 4a of the reflective mask 200 is formed.

As the material of the upper layer 44, there can be used a Co—X alloy, a Ni—X alloy, and a CoNi—X alloy obtained by adding at least one or more additive elements (X) of tungsten (W), niobium (Nb), tantalum (Ta), titanium (Ti), zirconium (Zr), hafnium (Hf), yttrium (Y), phosphorus (P), and tin (Sn) to at least one or more elements of cobalt (Co) and nickel (Ni). The additive element (X) preferably includes tungsten (W), tantalum (Ta) and/or tin (Sn), and more preferably includes tantalum (Ta). The material of the upper layer 44 includes an appropriate additive element (X), whereby the upper layer 44 can be controlled at an appropriate etching rate while the high extinction coefficient (absorption coefficient) is maintained.

Specifically, as the material of the upper layer 44, Co alone, Ni alone, CoTa$_3$, CoTa, Co$_3$Ta, NiTa$_3$, NiTa, or NiTa$_3$ can be preferably used.

A total concentration of cobalt (Co) and nickel (Ni) in the material of the upper layer 44 is preferably 10 atomic % or more, and more preferably 20 atomic % or more. Additionally, the total concentration of cobalt (Co) and nickel (Ni) is preferably 90 atomic % or less, and more preferably 85 atomic % or less.

In a case where the material of the upper layer 44 includes cobalt (Co), the concentration of cobalt (Co) is preferably 10 atomic % or more, and more preferably 20 atomic % or more. Additionally, the concentration of cobalt (Co) is preferably 90 atomic % or less, and more preferably 85 atomic % or less.

In a case where the material of the upper layer 44 includes nickel (Ni), the concentration of nickel (Ni) is preferably 10 atomic % or more, and more preferably 20 atomic % or more. Additionally, the concentration of nickel (Ni) is preferably 90 atomic % or less, and more preferably 85 atomic % or less.

In a case where the additive element (X) is tantalum (Ta), tungsten (W) or tin (Sn), the concentration of tantalum (Ta), tungsten (W), or tin (Sn) is preferably 10 atomic % or more, and more preferably 15 atomic % or more. Additionally, the concentration of tantalum (Ta), tungsten (W), or tin (Sn) is preferably 90 atomic % or less, and more preferably 80 atomic % or less.

In a case where the additive element (X) of the Co—X alloy is Ta, the composition ratio of Co to Ta (Co:Ta) is preferably 9:1 to 1:9, and more preferably 4:1 to 1:4. When the composition ratio of Co to Ta was 3:1, 1:1, and 1:3, each sample was analyzed by an X-ray diffractometer (XRD) and cross-sectional transmission electron microscopy (TEM) observation was performed, Co and Ta-derived peaks changed while the widths of the peaks became broad, and the sample became an amorphous structure.

In a case where the additive element (X) of the Ni—X alloy is Ta, the composition ratio of Ni to Ta (Ni:Ta) is preferably 9:1 to 1:9, and more preferably 4:1 to 1:4. When the composition ratio of Ni to Ta was 3:1, 1:1, and 1:3, each sample was analyzed by the X-ray diffractometer (XRD) and cross-sectional TEM observation was performed, Ni and Ta-derived peaks changed while the widths of the peaks became broad, and the sample became an amorphous structure.

Additionally, in a case where the additive element (X) of the CoNi—X alloy is Ta, the composition ratio of CoNi to Ta (CoNi:Ta) is preferably 9:1 to 1:9, and more preferably 4:1 to 1:4.

Additionally, in addition to the above additive element (X), the Co—X alloy, Ni—X alloy, or CoNi—X alloy may include other elements such as nitrogen (N), oxygen (N) and oxygen (O), carbon (C), and/or boron (B) within a range that does not significantly affect the refractive index and extinction coefficient.

The extinction coefficient k of the material of the upper layer 44 is preferably 0.035 or more, more preferably 0.040 or more, and more preferably 0.045 or more.

As the material of the lower layer 42, a material including tantalum (Ta), tungsten (W), and/or tin (Sn) is preferable. As the material of the lower layer 42, a material obtained by adding the material of the upper layer 44 to at least one or more elements of tantalum (Ta), tungsten (W), and tin (Sn) can be used. Additionally, as the material of the lower layer 42, a material obtained by adding nitrogen (N) to at least one or more elements of tantalum (Ta), tungsten (W), and tin (Sn) can be used in order to further increase the etching rate.

In a case where the material of the lower layer 42 includes any one of Ta, W, and Sn, the concentration of Ta, W, or Sn is preferably 50 atomic % or more, and more preferably 70 atomic % or more. Additionally, in a case where the material of the lower layer 42 includes a plurality of materials selected from Ta, W, and Sn, a total concentration of Ta, W, and Sn is preferably 50 atomic % or more, and more preferably 70 atomic % or more.

In a case where the material of the lower layer 42 includes Ta, W or Sn, and N, a total of concentrations of Ta, W or Sn, and N is preferably 60 atomic % or more, and more preferably 80 atomic % or more.

In a case where the material of the lower layer 42 includes Co, Co content is preferably 50 atomic % or less, and more preferably 35 atomic % or less. Additionally, in a case where the material of the lower layer 42 includes Ni, Ni content is preferably 50 atomic % or less, and more preferably 35 atomic % or less.

Additionally, the material of the lower layer 42 may also include other elements such as oxygen (O), carbon (C), or boron (B) within a range that does not significantly affect the etching rate, refractive index, and extinction coefficient.

In the reflective mask blank 100 of the embodiment shown in FIG. 2, it is preferable that the material of the upper layer 44 includes cobalt (Co) and tantalum (Ta), and the material of the lower layer 42 includes tantalum (Ta). Additionally, it is preferable that the material of the upper layer 44 includes nickel (Ni) and tantalum (Ta), and the material of the lower layer 42 includes tantalum (Ta). Cobalt (Co) and nickel (Ni) are high absorption coefficient elements, and tantalum (Ta) is an element that increases the dry etching rate.

The material of the upper layer 44 includes cobalt (Co) or nickel (Ni) in addition to tantalum (Ta), whereby the extinction coefficient k can be increased and as a result, the absorber film 4 can be thinned.

Specifically, as the material of the upper layer 44 including cobalt (Co) and tantalum (Ta), CoTa$_3$, CoTa, or Co$_3$Ta can be preferably used. Specifically, as the material of the upper layer 44 including nickel (Ni) and tantalum (Ta), NiTa$_3$, NiTa, or Ni$_3$Ta can be preferably used.

The material of the lower layer 42 includes tantalum (Ta), whereby the etching rate of the lower layer 42 can be increased as compared with the upper layer 44. The etching rate at the final stage of etching of the absorber film 4 can be increased. As a result, it is possible to further ensure that the cross-sectional shape of the absorber pattern 4a is prevented from becoming a tapered shape.

As the material of the lower layer 42 including tantalum (Ta), specifically, TaN, TaBN, CoTa$_3$, or NiTa$_3$ can be preferably used in addition to Ta alone.

The upper layer 44 of the reflective mask blank 100 of the embodiment shown in FIG. 2 preferably includes a material that can be etched by a dry etching gas including a first chlorine-based gas, and the lower layer 42 preferably includes a material that can be etched by a dry etching gas including a second chlorine-based gas different from the first chlorine-based gas.

As the first chlorine-based gas for etching the upper layer 44, it is possible to use one selected from at least one or more kinds selected from a group consisting of a chlorine-based gas such as Cl$_2$, SiCl$_4$, CHCl$_3$, CCl$_4$, and BCl$_3$, a mixed gas of two or more kinds selected from these chlorine-based gases, and a mixed gas including a chlorine-based gas and He at a predetermined ratio, a mixed gas including a chlorine-based gas and Ar at a predetermined ratio. $Cl_2$ or $BCl_3$ is preferably used as the first chlorine-based gas. In particular, in a case where the material of the upper layer 44 is Co alone, Ni alone, $CoTa_3$, CoTa, $Co_3Ta$, $NiTa_3$, NiTa, or $NiTa_3$, $BCl_3$ is preferably used as the first chlorine-based gas.

As etching gas for etching the lower layer 42, it is possible to use one selected from at least one or more kinds selected from a group consisting of a chlorine-based gases such as $Cl_2$, $SiCl_4$, $CHCl_3$, $CCl_4$, and $BCl_3$, a mixed gas of two or more kinds selected from these chlorine-based gases, a mixed gas including a chlorine-based gas and He at a predetermined ratio, a mixed gas including a chlorine-based gas and Ar at a predetermined ratio, a halogen gas including at least one selected from a fluorine gas, a chlorine gas, a bromine gas, and iodine gas, and a hydrogen halide gas. As other etching gases, it is possible to use one selected from a fluorine-based gas such as $CF_4$, $CHF_3$, $C_2F_6$, $C_3F_6$, $C_4F_6$, $C_4F_6$, $CH_2F_2$, $CH_3F$, $C_3F_8$, $SF_6$, and $F_2$, a mixed gas including a fluorine-based gas and $O_2$ at a predetermined ratio, and the like. As the second chlorine-based gas for etching the lower layer 42, it is possible to use one selected from at least one or more kinds selected from a group consisting of a chlorine-based gas such as $Cl_2$, $SiCl_4$, $CHCl_3$, $CCl_4$, and $BCl_3$, a mixed gas of two or more kinds selected from these chlorine-based gases, a mixed gas including a chlorine-based gas and He at a predetermined ratio, and a mixed gas including a chlorine-based gas and Ar at a predetermined ratio. $Cl_2$ or $BCl_3$ is preferably used as the second chlorine-based gas. In particular, in a case where the material of the lower layer 42 is TaN or TaBN, $Cl_2$ is preferably used as the second chlorine-based gas. Additionally, in a case where the material of the lower layer 42 is $CoTa_3$ or $NiTa_3$, $BCl_3$ is preferably used as the second chlorine-based gas.

The etching rate of the lower layer 42 is preferably 1.5 times or more, and more preferably 3 times or more the etching rate of the upper layer 44. Additionally, the etching rate of the lower layer 42 is preferably 10 times or less, and more preferably 8 times or less the etching rate of the upper layer 44. For example, the materials and etching gases of the upper layer 44 and the lower layer 42 can be selected on the basis of ratios of the etching rate shown in Table 2 to be described later. The upper layer 44 and the lower layer 42 can also be etched by the same etching gas.

According to the present embodiment, the upper layer 44 and the lower layer 42 each include the material that can be etched by a predetermined dry etching gas, whereby the etching rate can be appropriately adjusted. Therefore, it is possible to further ensure that the cross-sectional shape of the pattern formed on the reflective mask 200 is prevented from becoming a tapered shape.

The absorber film 4 of the present embodiment can be formed by a publicly known method, for example, a magnetron sputtering method such as a direct current (DC) sputtering method and a radio frequency (RF) sputtering method. Additionally, as a target, an alloy target corresponding to the predetermined absorber film 4 can be used. Additionally, co-sputtering using a plurality of kinds of elemental metals or alloy targets corresponding to a plurality of kinds of metals constituting the predetermined absorber film 4 can also be used.

The absorber film 4 can be preferably an absorber film 4 for the purpose of absorbing EUV light as the binary-type reflective mask blank 100. Additionally, the absorber film 4 can be an absorber film 4 having a phase shift function as a reflective mask blank 100 of a phase shift type in consideration of a phase difference of EUV light.

In the case of the absorber film 4 for the purpose of absorbing EUV light, the film thickness thereof is set so that the reflectance of EUV light to the absorber film 4 is 2% or less, and preferably 1% or less. Additionally, the film thickness (total film thickness) of the absorber film 4 is required to be less than 60 nm, and more preferably 50 nm or less in order to reduce the shadowing effect.

The film thickness of the upper layer 44 is preferably 25% or more, and more preferably 50% or more with respect to the film thickness of the absorber film 4. Additionally, the film thickness of the upper layer 44 is preferably 98% or less, and more preferably 90% or less with respect to the film thickness of the absorber film 4.

In the case of the absorber film 4 having a phase shift function, in a portion where the absorber film 4 is formed, part of the light is reflected at a level that does not adversely affect pattern transfer while EUV light is absorbed and reduced, and a desired phase difference with reflected light from a field portion reflected from the multilayer reflective film 2 via the protective film 3 is formed. The absorber film 4 is formed so that the phase difference between the reflected light from the absorber film 4 and the reflected light from the multilayer reflective film 2 is 160 to 200 degrees. Beams of the light having a reversed phase difference in the neighborhood of 180 degrees interfere with each other at a pattern edge portion, whereby the image contrast of a projected optical image is improved. As the image contrast is improved, resolution is increased and various exposure-related margins such as an exposure margin and a focus margin increase. Although the following depends on the shape of a pattern and exposure conditions, in general, the standard of reflectance for obtaining this phase shift effect is 1% or more in terms of absolute reflectance, and a reflection ratio with respect to the multilayer reflective film 2 (with the protective film 3) is 2% or more.

In a case where the absorber film 4 is a multilayer film, an antireflection film can be formed on the upper layer 44. Reducing surface reflection with an antireflection film is useful, for example, at the time of a mask pattern inspection using Deep Ultraviolet (DUV) light. Therefore, an optical constant and film thickness of the antireflection film are preferably appropriately set so that the antireflection film has an antireflection function against DUV light. Additionally, the upper layer 44 may have an antireflection function. The reflective mask blank 100 of the present embodiment has the antireflection film, whereby inspection sensitivity at the time of the mask pattern inspection using light such as DUV light is improved.

Additionally, the absorber film 4 is formed to be a multilayer film, whereby various functions can be added. In a case where the absorber film 4 has a phase shift function, the absorber film 4 is formed to be a multilayer film, whereby a range of adjustment on the optical surface expands and it becomes easy to obtain desired reflectance.

Additionally, an oxide layer may be formed on the surface of the absorber film 4. The oxide layer is formed on the surface of the absorber film 4, whereby the cleaning resistance of the absorber pattern 4a of the obtained reflective mask 200 can be improved. The thickness of the oxide layer is preferably 1.0 nm or more, and more preferably 1.5 nm or more. Additionally, the thickness of the oxide layer is preferably 5 nm or less, and more preferably 3 nm or less. In a case where the thickness of the oxide layer is less than 1.0 nm, the thickness of the oxide layer is too thin and no effect can be expected. Additionally, in a case where the thickness of the oxide layer exceeds 5 nm, influence on the surface reflectance with respect to mask inspection light becomes large, and it becomes difficult to perform control for obtaining predetermined surface reflectance.

A method of forming the oxide layer includes subjecting the mask blank after the absorber film 4 to hot water treatment, ozone water treatment, heat treatment in an oxygen-containing gas, ultraviolet irradiation treatment, and $O_2$ plasma treatment in an oxygen-containing gas, and the like. Additionally, in a case where the surface of the absorber film 4 is exposed to the atmosphere after the absorber film 4 is formed, an oxide layer due to natural oxidation may be formed on a surface layer. In particular, in the case of a CoTa alloy including Ta that is easily oxidized, a NiTa alloy, or a CoNiTa alloy, an oxide layer having a film thickness of 1 to 2 nm is formed.

Additionally, as described above, in the case of the absorber film 4 having a two-layer structure, for the upper layer 44 and the lower layer 42, it is possible to use one selected from chlorine-based gases such as $Cl_2$, $SiCl_4$, $CHCl_3$, $CCl_4$, and $BCl_3$, a mixed gas of two or more kinds selected from these chlorine-based gases, a mixed gas including chlorine-based gas and He at a predetermined ratio, and a mixed gas including chlorine-based gas and Ar at a predetermined ratio. Additionally, the upper layer 44 and the lower layer 42 can be etched using different chlorine-based etching gases. A first etching gas may be a chlorine-based gas including $BCl_3$ gas, and a second etching gas may be a chlorine-based gas including $Cl_2$ gas or the like that is different from the first etching gas or a fluorine-based gas. As a result, the oxide layer can be easily removed, and the etching time of the absorber film 4 can be shortened.

Note that when oxygen is included in the etching gas in the final stage of etching the absorber film 4, surface roughness occurs on the Ru-based protective film 3. For this reason, it is preferable to use an etching gas that does not include oxygen in an over-etching stage in which the Ru-based protective film 3 is exposed to etching.

<<Etching Mask Film 6>>

As shown in FIG. 4, the reflective mask blank 100 of the present embodiment preferably has the etching mask film 6 on the absorber film 4 (on the upper layer 44 in a case where the absorber film 4 has the upper layer 44). Additionally, the etching mask film 6 preferably including a material including chromium (Cr) or a material including silicon (Si). The reflective mask blank 100 of the present embodiment has the predetermined etching mask film 6, whereby the transfer pattern can be accurately formed on the absorber film 4.

As a material of the etching mask film 6, a material having a high etching selective ratio of the absorber film 4 (upper layer 44 in a case where the absorber film 4 has the upper layer 44) to the etching mask film 6 is used. Here, the expression of "an etching selective ratio of B to A" means a ratio of an etching rate of A that is a layer that is not desired to be etched (layer to serve as a mask) to an etching rate of B that is a layer that is desired to be etched. Specifically, "an etching selective ratio of B to A" is specified by the formula of "an etching selective ratio of B to A=an etching rate of B/an etching rate of A". Additionally, the expression of "high selective ratio" means that a value of the selective ratio defined above is large as compared with that of an object for comparison. The etching selective ratio of the absorber film 4 (upper layer 44) to the etching mask film 6 is preferably 1.5 or more, and more preferably 3 or more.

Examples of the material having a high etching selective ratio of the absorber film 4 (upper layer 44) to the etching mask film 6 include a chromium material and a chromium compound material. In this case, the absorber film 4 can be etched by a chlorine-based gas. Examples of the chromium compound include a material including Cr and at least one element selected from N, O, C, and H. As the Cr compound, for example, CrN, CrON, CrCN, CrCO, CrCON, CrBN, CrBON, CrBCN, and CrBOCN can be mentioned. In order to increase the etching selective ratio with a chlorine-based gas, it is preferable to use a material substantially including no oxygen. As the chromium compound substantially including no oxygen, for example, CrN, CrCN, CrBN, and CrBCN can be mentioned. The Cr content of the chromium compound is preferably 50 atomic % or more and less than 100 atomic %, and more preferably 80 atomic % or more and less than 100 atomic %. Additionally, the expression of "substantially including no oxygen" corresponds to a chromium compound having an oxygen content of 10 atomic % or less, and preferably 5 atomic % or less. Note that the material can contain a metal other than chromium within a range in which the effects of the present embodiment can be obtained.

Additionally, in a case where the absorber film 4 (upper layer 44) is etched by a chlorine-based gas substantially including no oxygen, a silicon material or a silicon compound material can be used as the etching mask film. Examples of the silicon compound include materials such as a material including Si and at least one element selected from N, O, C, and H, metallic silicon including a metal in silicon or a silicon compound (metal silicide), and a metal silicon compound (metal silicide compound). Specific examples of a material including silicon include SiO, SiN, SiON, SiC, SiCO, SiCN, SiCON, MoSi, MoSiO, MoSiN, and MoSiON. Note that the material can contain a metalloid or metal other than silicon within a range in which the effects of the present embodiment can be obtained.

The film thickness of the etching mask film 6 is desirably 3 nm or more from the viewpoint of obtaining a function as an etching mask for accurately forming the transfer pattern on the absorber film 4 (upper layer 44). Additionally, the film thickness of the etching mask film 6 is desirably 15 nm or less, and more preferably 10 nm or less from the viewpoint of reducing the film thickness of a resist film.

<<Etching Stopper Film 7>>

As shown in FIG. 5, the reflective mask blank 100 of the present embodiment preferably has the etching stopper film 7 between the protective film 3 and the absorber film 4 (lower layer 42 in a case where the absorber film 4 has the lower layer 42). Additionally, the etching stopper film 7 preferably includes a material including chromium (Cr) or a material including silicon (Si). The reflective mask blank 100 of the present embodiment has the predetermined etching stopper film 7, whereby it is possible to reduce damage to the protective film 3 and the multilayer reflective film 2 when the absorber film 4 is etched.

As a material of the etching stopper film 7, it is preferable to use a material having a high etching selective ratio of absorber film 4 to the etching stopper film 7 in dry etching using a chlorine-based gas (etching rate of the absorber film 4 (lower layer 42)/etching rate of the etching stopper film 7)). Examples of such a material include materials of chromium and chromium compounds. Examples of the chromium compound include a material including Cr and at least one element selected from N, O, C, and H. As the Cr compound, for example, CrN, CrON, CrCN, CrCO, CrCON, CrBN, CrBON, CrBCN, and CrBOCN can be mentioned. In order to increase the etching selective ratio with a chlorine-based gas, it is preferable to use a material substantially including no oxygen. As the chromium compound substantially including no oxygen, for example, CrN, CrCN, CrBN, and CrBCN can be mentioned. The Cr content of the chromium compound is preferably 50 atomic % or more and less than 100 atomic %, and more preferably 80 atomic % or more and less than 100 atomic %. Note that the material of the etching stopper film 7 can contain a metal other than chromium within a range in which the effects of the present embodiment can be obtained.

Additionally, when the absorber film 4 (lower layer 42) is etched with a chlorine-based gas, a silicon material or a silicon compound material can be used for the etching stopper film 7. Examples of the silicon compound include materials such as a material including Si and at least one element selected from N, O, C, and H, metallic silicon including a metal in silicon or a silicon compound (metal silicide), and a metal silicon compound (metal silicide compound). Specific examples of a material including silicon include SiO, SiN, SiON, SiC, SiCO, SiCN, SiCON, MoSi, MoSiO, MoSiN, and MoSiON. Note that the material can contain a metalloid or metal other than silicon within a range in which the effects of the present embodiment can be obtained.

Additionally, the etching stopper film 7 is preferably formed of the same material as the material of the above etching mask film 6. As a result, the above etching mask film 6 can be removed at the same time when the etching stopper film 7 is patterned. Additionally, the etching stopper film 7 and the etching mask film 6 may be formed of a chromium compound or a silicon compound, and the composition ratios of the etching stopper film 7 and the etching mask film 6 may be different from each other.

The film thickness of the etching stopper film 7 is preferably 2 nm or more from the viewpoint of preventing optical characteristics from changing due to damaging to the protective film 3 when the absorber film 4 (lower layer 42) is etched. Additionally, the film thickness of the etching stopper film 7 is preferably 7 nm or less, and more preferably 5 nm or less from the viewpoint of reducing the total film thickness of the absorber film 4 and the etching stopper film 7, that is, reducing the height of a pattern including the absorber pattern 4a and the etching stopper pattern.

Additionally, in a case where the etching stopper film 7 and the etching mask film 6 are etched at the same time, the film thickness of the etching stopper film 7 is preferably the same as or thinner than the film thickness of the etching mask film 6. Furthermore, in a case where (film thickness of the etching stopper film 7)≤(film thickness of the etching mask film 6) holds, the relationship of (etching rate of the etching stopper film 7)≤(etching rate of the etching mask film 6) is preferably satisfied.

<<Conductive Back Film 5>>

The conductive back film 5 for an electrostatic chuck is generally formed on the side of the second main surface (back surface) of the substrate 1 (side opposite to a forming face of the multilayer reflective film 2). An electrical characteristic (sheet resistance) required of the conductive back film 5 for an electrostatic chuck is usually 100Ω/☐ (Ω/square) or less. A method of forming the conductive back film 5 can be formed, for example, by a magnetron sputtering method or an ion beam sputtering method using a target of a metal such as chromium and tantalum or an alloy thereof.

A material including chromium (Cr) for the conductive back film 5 is preferably a Cr compound containing Cr and at least one selected from boron, nitrogen, oxygen, and carbon. As the Cr compound, for example, CrN, CrON, CrCN, CrCO, CrCON, CrBN, CrBON, CrBCN, and CrBOCN can be mentioned.

As a material including tantalum (Ta) for the conductive back film 5, it is preferable to use Ta (tantalum), an alloy containing Ta, or a Ta compound containing either of Ta or the alloy containing Ta and at least one from boron, nitrogen, oxygen, and carbon. As the Ta compound, for example, TaB, TaN, TaO, TaON, TaCON, TaBN, TaBO, TaBON, TaBCON, TaHf, TaHfO, TaHfN, TaHfON, TaHfCON, TaSi, TaSiO, TaSiN, TaSiON, and TaSiCON can be mentioned.

As a material including tantalum (Ta) or chromium (Cr), an amount of nitrogen (N) present in the surface layer thereof is preferably small. Specifically, it is preferable that nitrogen content in the surface layer of the conductive back film 5 of the material including tantalum (Ta) or chromium (Cr) is less than 5 atomic %, and it is more preferable that the surface layer substantially contains no nitrogen. This is because in the conductive back film 5 of the material including tantalum (Ta) or chromium (Cr), the lower the nitrogen content in the surface layer is, the higher wear resistance is.

The conductive back film 5 preferably includes a material including tantalum and boron. The conductive back film 5 includes the material including tantalum and boron, whereby a conductive film 23 having wear resistance and chemical resistance can be obtained. In a case where the conductive back film 5 includes tantalum (Ta) and boron (B), B content is preferably 5 to 30 atomic %. The ratio of Ta to B (Ta:B) in a sputtering target used for forming the conductive back film 5 is preferably from 95:5 to 70:30.

The thickness of the conductive back film 5 is usually 10 nm to 200 nm though there is no particular limitation on the thickness as long as a function as being for an electrostatic chuck is satisfied. Additionally, the conductive back film 5 also has a function of adjusting stress on the side of the second main surface of the mask blank 100, and is adjusted so that a balance with stress from various films formed on the side of the first main surface is kept and the flat reflective mask blank 100 can be obtained.

<Reflective Mask 200 and Method of Manufacturing the Same>

The present embodiment is the reflective mask 200 having the absorber pattern 4a in which the absorber film 4 of the reflective mask blank 100 of the embodiment described above is partnered.

The reflective mask 200 is manufactured using the reflective mask blank 100 of the present embodiment. Here, an outline description will be only given, and a detailed description will be given below in Examples with reference to the drawings (FIGS. 3A-3D).

The reflective mask blank 100 is prepared, and the resist film 11 is formed on the absorber film 4 on the side of the first main surface thereof (this is unnecessary in a case where the resist film 11 is provided as the reflective mask blank 100), a desired pattern is drawn (exposed) on the resist film 11 and further developed and rinsed, whereby a predetermined resist pattern 11a is formed.

In the case of the reflective mask blank 100, the absorber film 4 is etched using the resist pattern 11a as a mask to form the absorber pattern 4a, and the resist pattern 11a is removed by ashing, a resist stripping solution, or the like, whereby the absorber pattern 4a is formed. Finally, wet cleaning is performed using an acidic or alkaline aqueous solution.

In a method of manufacturing the reflective mask 200 of the present embodiment, the absorber pattern 4a is preferably formed by patterning the absorber film 4 of the reflective mask blank 100 by dry etching using a chlorine-based gas. Specifically, as an etching gas for the absorber film 4, a chlorine-based gas such as $Cl_2$, $SiCl_4$, $CHCl_3$, $CCl_4$, and $BCl_3$, a mixed gas including a chlorine-based gas and He at a predetermined ratio, a mixed gas including a chlorine-based gas and Ar at a predetermined ratio, and the like is used. Since the etching gas substantially includes no oxygen in etching of the absorber film 4, surface roughness does not occur on the Ru-based protective film 3. The gas substantially including no oxygen corresponds to a gas having an oxygen content of 5 atomic % or less.

In the method of manufacturing a reflective mask 200 of the present embodiment, the absorber pattern 4a is preferably formed by patterning the absorber film 4 of the reflective mask blank 100 of the embodiment described above by dry etching using a first chlorine-based gas and a second chlorine-based gas different from the first chlorine-based gas. The first chlorine-based gas and the second chlorine-based gas are as described above.

In the method of manufacturing the reflective mask 200 of the present embodiment, it is possible to ensure that the cross-sectional shape of a pattern is prevented from becoming a tapered shape when the absorber pattern 4a of the reflective mask 200 is formed. Additionally, since a metal material having a high extinction coefficient k can be used as the absorber film 4 in this reflective mask 200, the film thickness of the absorber film 4 can be reduced. As a result, it is possible to ensure that the shadowing effect of the reflective mask 200 can be reduced and the reflective mask 200 having the fine and highly accurate absorber pattern 4a can be obtained.

<Method of Manufacturing Semiconductor Device>

EUV exposure is performed using the reflective mask 200 of the present embodiment (lithography step), whereby a desired transfer pattern based on the resist film 11 formed on the semiconductor substrate (transfer-receiving substrate) is transferred on the absorber pattern 4a of the reflective mask 200. In the lithography process, an EUV exposure apparatus having an exposure light source that emits EUV light is used. In addition to this lithography step, various steps such as etching of a film to be processed, formation of an insulating film and a conductive film, introduction of a dopant, or annealing are undergone, whereby it is possible to manufacture a semiconductor device on which a desired electronic circuit is formed.

The reflective mask 200 of the present embodiment can prevent the cross-sectional shape of the absorber pattern 4a from becoming a tapered shape. Additionally, since a metal material having a high extinction coefficient k can be used as the absorber film 4, the film thickness of the absorber film 4 can be reduced. As a result, since the shadowing effect of the reflective mask 200 can be reduced when the semiconductor device is manufactured, the semiconductor device having a fine and highly accurate transfer pattern can be manufactured.

More specifically, the EUV exposure apparatus includes a laser plasma light source that generates EUV light, an illumination optical system, a mask stage system, a reduction projection optical system, a wafer stage system, and vacuum equipment, and the like. The light source is provided with a debris trap function, a cut filter that cuts light having a long wavelength other than exposure light, equipment for vacuum differential pumping, and the like. The illumination optical system and the reduction projection optical system each include a reflection mirror. The reflective mask 200 for EUV exposure is electrostatically attracted by the conductive film formed on the second main surface of the reflective mask 200 and is mounted on the mask stage.

The light of the EUV light source is applied to the reflective mask 200 through the illumination optical system at an angle tilted by six to eight degrees with respect to a vertical plane of the reflective mask 200. Reflected light from the reflective mask 200 with respect to this incident light is reflected (regularly reflected) in a direction opposite to an incident direction and at the same angle as an incident angle, guided to a reflective projection system usually having a reduction ratio of ¼, and exposed on a resist on a wafer (semiconductor substrate) mounted on a wafer stage. During this time, at least a place through which EUV light passes is evacuated. Additionally, when this exposure is performed, mainstream exposure is scan exposure in which the mask stage and the wafer stage are synchronously scanned at a speed corresponding to the reduction ratio of the reduction projection optical system, and exposure is performed through a slit. This resist film that has been subjected to the exposure is developed, whereby a resist pattern can be formed on the semiconductor substrate. In the present embodiment, the reflective mask 200 having the absorber pattern 4a with thin film thickness and a small shadowing effect is used. Therefore, the resist pattern formed on the semiconductor substrate is desired one with high dimensional accuracy. Then, etching or the like is performed using this resist pattern as a mask, whereby a predetermined wiring pattern can be formed, for example, on the semiconductor substrate. The semiconductor device is manufactured through such an exposure step and other necessary steps such as a step of processing a film to be processed, a step of forming an insulating film and a conductive film, a step of introducing a dopant, an annealing step, and other necessary steps.

Examples

Hereinafter, Examples will be described with reference to the drawings. The present disclosure is not limited to these Examples.

FIG. 1 shows a structure of reflective mask blanks 100 of Examples 1 to 15. The reflective mask blanks 100 of the Examples each include a conductive back film 5, a substrate 1, a multilayer reflective film 2, a protective film 3, and an absorber film 4. Table 1 shows materials and film thicknesses of the absorber films 4 of the reflective mask blanks 100 of the Examples. As shown in Table 1, the absorber films 4 of Examples 1 to 15 each include two layers, that is, a lower layer 42 and an upper layer 44. Note that the reflective mask blanks 100 of Reference Examples 1 and 2 were manufactured as objects for comparison to the Examples. As shown in Table 1, the absorber films 4 of Reference Examples 1 and 2 each include only a single layer (upper layer 44).

The reflective mask blank 100 of the Examples and Reference Examples will be specifically described.

First, the substrate 1 was prepared as follows in order to manufacture the reflective mask blank 100 of the Examples and Reference Examples. That is, a $SiO_2$—$TiO_2$-based glass substrate that is a low thermal expansion glass substrate having a size of 6025 (approximately 152 mm×152 mm×6.35 mm) and having both polished main surfaces that are a first main surface and a second main surface was prepared. The surfaces of the $SiO_2$—$TiO_2$-based glass substrate were polished by a rough polishing step, a fine polishing step, a local processing step, and a touch polishing step so that the $SiO_2$—$TiO_2$-based glass substrate has flat and smooth main surfaces. In this way, the substrate 1 including the $SiO_2$—$TiO_2$-based glass substrate was prepared.

Next, the conductive back film 5 including a CrN film was formed on the second main surface (back surface) of the substrate 1 by a magnetron sputtering (reactive sputtering) method under the following conditions.

Conditions for forming the conductive back film 5: a Cr target, a mixed gas atmosphere of Ar and $N_2$ (Ar:90%, N:10%), and a film thickness of 20 nm.

Next, the multilayer reflective film 2 was formed on the main surface (first main surface) of the substrate 1 on a side opposite to a side on which the conductive back film 5 is formed. The multilayer reflective film 2 formed on the substrate 1 was a periodic multilayer reflective film including Mo and Si in order to make the multilayer reflective film 2 suitable for EUV light having a wavelength of 13.5 nm. The multilayer reflective film 2 was formed using a Mo target and a Si target and alternately layering a Mo layer and a Si layer on the substrate 1 by an ion beam sputtering method in an Ar gas atmosphere. First, a Si film was formed with a thickness of 4.2 nm, and then a Mo film was formed with a thickness of 2.8 nm. This formation was counted as one period, and the Si film and the Mo film were layered for 40 periods in a similar manner. Finally, a Si film was formed with a thickness of 4.0 nm and the multilayer reflective film 2 was formed.

Subsequently, the protective film 3 including a Ru film was formed with a thickness of 2.5 nm by an ion beam sputtering method using a Ru target in the Ar gas atmosphere.

Next, the absorber film 4 including the lower layer 42 and the upper layer 44 of materials shown in Table 1 or the absorber film 4 including only the upper layer 44 was formed while being in contact with the protective film 3 by a direct current (DC) magnetron sputtering method so that the absorber film 4 has the film thickness shown in Table 1. The reflectance of the formed absorber film 4 to EUV light was 2%.

Among materials of the lower layer 42 and the upper layer 44 shown in Table 1, a $CoTa_3$ layer, a CoTa layer, a $Co_3Ta$ layer, a $NiTa_3$ layer, a NiTa layer, and a $Ni_3Ta$ layer were formed by a DC magnetron sputtering method so that an atomic ratio of Co, Ni, and Ta.) was a stoichiometric ratio (atomic ratio). Specifically, a film was formed by the DC magnetron sputtering method using a predetermined target (for example, a target of a $CoTa_3$ alloy in the case of forming the $CoTa_3$ layer) in an Ar gas atmosphere so that the composition of an obtained layer (film) was in a stoichiometric ratio (atomic ratio).

The composition (atomic ratio) of the $CoTa_3$ layer was Co:Ta=25:75, the composition of the CoTa layer (atomic ratio) was Co:Ta=50:50, and the composition (atomic ratio) of the $Co_3Ta$ layer was Co:Ta=75:25. Additionally, the composition (atomic ratio) of the $NiTa_3$ layer was Ni:Ta=25:75, the composition of the NiTa layer (atomic ratio) was Ni:Ta=50:50, and the composition of the $Ni_3Ta$ layer (atomic ratio) was Ni:Ta=75:25.

Among the materials of the lower layer 42 shown in Table 1, a TaBN film (membrane) was formed by reactive sputtering using a TaB mixed sintering target (Ta:B=80:20, atomic ratio) in a mixed gas atmosphere of Ar gas and $N_2$ gas. The composition (atomic ratio) of the TaBN film was Ta:B:N=75:12:13. Note that Ta and N are elements that increase the dry etching rate.

Table 2 shows measurement results of refractive indexes n and absorption coefficients k of obtained layers (films). Layers (films) of the same material were formed under the same conditions. Thus, the content ratio (atomic ratio), refractive index n, and extinction coefficient k of the layers (films) of the same material are the same even between different samples.

Additionally, when a crystal structure of the layer (film) formed as described above was measured by the X-ray diffractometer (XRD), it was confirmed that all the formed layers (films) had an amorphous structure.

As described above, the reflective mask blank 100 of the Examples and Reference Examples was manufactured.

Next, as shown in FIGS. 3A-3D, the reflective mask 200 was manufactured using the reflective mask blank 100 of the above Examples and Reference Examples. Note that in the absorber film 4 of FIGS. 3A-3D, the description of the lower layer 42 and the upper layer 44 is omitted, and the lower layer 42 and the upper layer 44 are described simply as the absorber film 4.

Figure 3A:
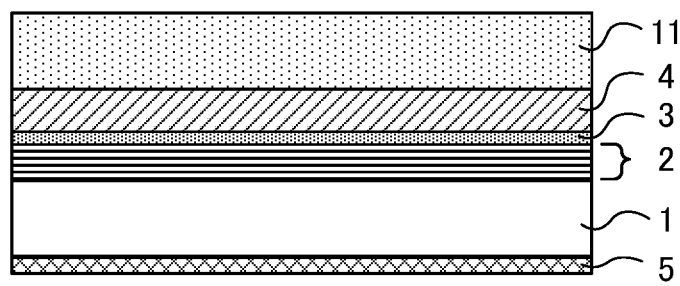
FIGS. 3A-3D are step diagrams showing, in a schematic cross-sectional diagram, a main part of a step of manufacturing a reflective mask from the reflective mask blank.
Figure 3B:
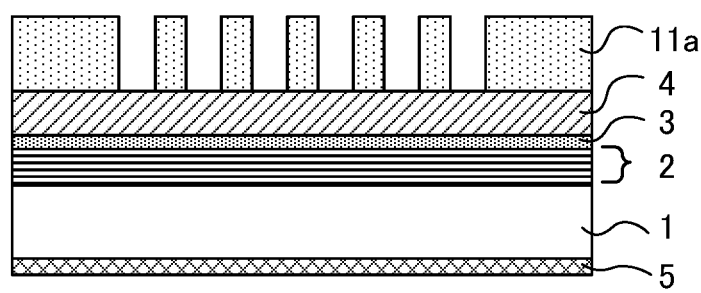
Figure 3C:
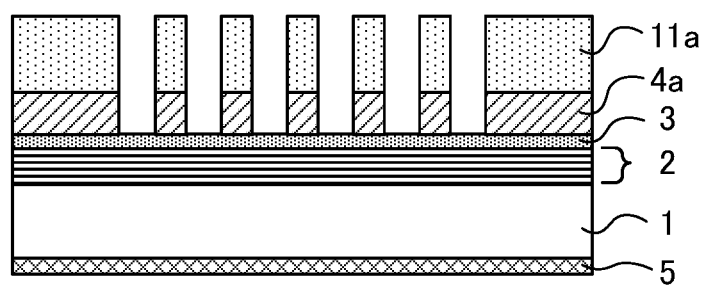

First, a resist film 11 was formed with a thickness of 150 nm on the absorber film 4 of the reflective mask blank 100 (FIG. 3A). Then, a desired pattern is drawn (exposed) on this resist film 11 and further developed and rinsed, whereby a predetermined resist pattern 11a was formed (FIG. 3B). Next, with use of the resist pattern 11a as a mask, the upper layer 44 and the lower layer 42 of the absorber film 4 were subjected to dry etching using an etching gas ($BCl_3$ or $Cl_2$) shown in Table 1 to form the absorber pattern 4a. (FIG. 3C).

When the absorber films 4 of Examples 5, 6, 8, 12, 13, and 15 among the Examples were etched, both the upper layer 44 and the lower layer 42 were subjected to dry etching using the same etching gas. As for the Examples other than Examples 5, 6, 8, 12, and 13, the upper layer 44 and the lower layer 42 were each subjected to dry etching using different etching gases. In a case where the upper layer 44 and the lower layer 42 were etched by different etching gases, the upper layer 44 and the lower layer 42 were continuously etched under the same etching condition except that the etching gas was switched after the etching of the upper layer 44 ended. Since the absorber films 4 of Reference Examples 1 and 2 are each a single-layer absorber film 4, the absorber films 4 were subjected to dry etching using one kind of etching gas shown in Table 1.

Table 2 shows a relative etching rate when a material used as the absorber film 4 was subjected to dry etching by the etching gas of $BCl_3$ or $Cl_2$. Note that the relative etching rate is a ratio of etching rates when an etching rate (nm/min) at the time of subjecting the $CoTa_3$ layer to dry etching by $BCl_3$ is 1. As is clear from Tables 1 and 2, in the dry etching of the absorber films 4 of the absorber films 4 of Examples 1 to 15, the etching rate of the lower layer 42 including a lower surface region 46 is faster than the etching rate of the upper layer 44 including an upper surface region 48.

Figure 3D:
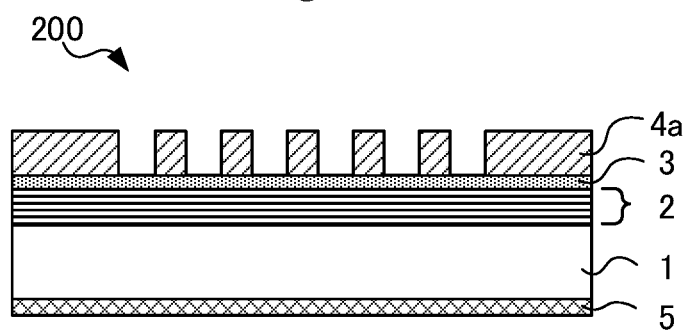

Thereafter, the resist pattern 11a was removed by ashing or a resist stripper liquid. Finally, wet cleaning was performed using deionized water (DIW) to manufacture the reflective mask 200 (FIG. 3D). Note that a mask defect inspection can be performed as necessary after the wet cleaning, and a mask defect can be corrected appropriately. In this way, the reflective masks 200 of the Examples and the Reference Examples each having the absorber pattern 4a were manufactured.

Figure 6:
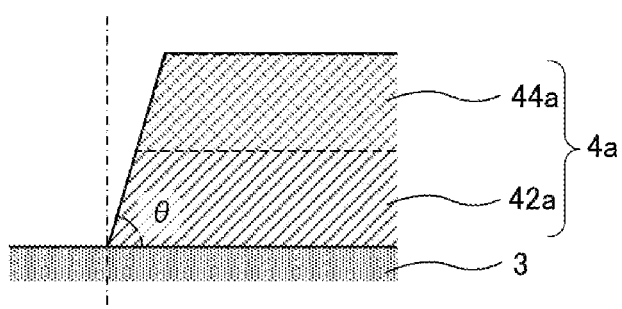
FIG. 6 is a schematic cross-sectional diagram for describing a taper angle θ of the absorber pattern.

Next, the shape of the absorber pattern 4a was evaluated by observing the cross sections of the reflective masks 200 of Examples and Reference Examples by a scanning electron microscope (SEM). Specifically, as shown in FIG. 6, an angle of a tapered shape (taper angle θ) of an edge portion of the absorber pattern 4a was measured. The taper angle θ is an angle between a surface parallel to the substrate 1 and a side surface of the absorber pattern 4a. In a case where the taper angle θ is 90 degrees, the side surface of the absorber pattern 4a is perpendicular to the surface parallel to the substrate 1 (see an alternate long and short dash line in FIG. 6). Table 2 shows measurement results of the taper angle θ. Generally, the taper angle θ is an angle of 90 degrees or less. Since the smaller the taper angle θ is, the more the edge portion of the absorber pattern 4a becomes a tapered shape, a problem arises when a fine pattern is transferred.

As is clear from Table 1, the taper angles of Reference Examples 1 and 2 each having the single-layer absorber film 4 were 70 degrees, whereas the taper angles θ of Examples 1 to 15 were 75 degrees or more. Thus, it can be said that the cross-sectional shapes of the absorber patterns 4a formed on the reflective masks 200 of Examples 1 to 15 were prevented from becoming a tapered shape.

The reflective masks 200 manufactured in Examples 1 to 15 were each set in an EUV exposure scanner, and EUV exposure was performed on a wafer on which a film to be processed and a resist film were formed on a semiconductor substrate. Then, this resist film that has been subjected to the exposure was developed, whereby a resist pattern was formed on the semiconductor substrate on which the film to be processed was formed.

Additionally, this resist pattern was transferred on the film to be processed by etching, and a semiconductor device having desired characteristics was manufactured through various steps such as formation of an insulating film and a conductive film, introduction of a dopant, and annealing,

TABLE 1

|  | Material of absorber film | | Film thickness of absorber film (nm) | | | Reflectance (%) | Dry etchant | | Taper angle θ (Degree) |
|---|---|---|---|---|---|---|---|---|---|
|  | Upper layer | Lower layer | Upper layer | Lower layer | Total |  | Upper layer | Lower layer |  |
| Example 1 | CoTa$_3$ | TaBN | 39.2 | 6.1 | 45.3 | 2% | BCl$_3$ | Cl$_2$ | 85 |
| Example 2 | CoTa$_3$ | TaBN | 24.2 | 22.2 | 46.4 | 2% | BCl$_3$ | Cl$_2$ | 90 |
| Example 3 | CoTa | TaBN | 37.1 | 0.7 | 37.8 | 2% | BCl$_3$ | Cl$_2$ | 75 |
| Example 4 | CoTa | TaBN | 25.6 | 13.3 | 38.9 | 2% | BCl$_3$ | Cl$_2$ | 80 |
| Example 5 | CoTa | CoTa$_3$ | 36.4 | 1.4 | 37.8 | 2% | BCl$_3$ |  | 75 |
| Example 6 | CoTa | CoTa$_3$ | 16 | 22.8 | 38.8 | 2% | BCl$_3$ |  | 80 |
| Example 7 | Co$_3$Ta | TaBN | 25.8 | 6.0 | 31.8 | 2% | BCl$_3$ | Cl$_2$ | 75 |
| Example 8 | Co$_3$Ta | CoTa$_3$ | 24.1 | 7.2 | 31.2 | 2% | BCl$_3$ |  | 75 |
| Reference Example 1 | Co$_3$Ta | — | 30.9 | — | 30.9 | 2% | BCl$_3$ |  | 70 |
| Example 9 | NiTa$_3$ | TaBN | 26.1 | 20.6 | 46.7 | 2% | BCl$_3$ | Cl$_2$ | 90 |
| Example 10 | NiTa | TaBN | 37.3 | 0.7 | 38 | 2% | BCl$_3$ | Cl$_2$ | 75 |
| Example 11 | NiTa | TaBN | 24.4 | 14.9 | 39.3 | 2% | BCl$_3$ | Cl$_2$ | 80 |
| Example 12 | NiTa | NiTa$_3$ | 36.6 | 1.4 | 38 | 2% | BCl$_3$ |  | 75 |
| Example 13 | NiTa | NiTa$_3$ | 10.3 | 29.3 | 39.5 | 2% | BCl$_3$ |  | 80 |
| Example 14 | Ni$_3$Ta | TaBN | 25 | 7.3 | 32.3 | 2% | BCl$_3$ | Cl$_2$ | 75 |
| Example 15 | Ni$_3$Ta | NiTa$_3$ | 19.6 | 12.7 | 32.3 | 2% | BCl$_3$ |  | 75 |
| Reference Example 2 | Ni$_3$Ta | — | 31.1 | — | 31.1 | 2% | BCl$_3$ |  | 70 |

TABLE 2

|  | Refractive index | Extinction coefficient | Relative etching rate | |
|---|---|---|---|---|
|  | n | k | BCl$_3$ | Cl$_2$ |
| CoTa$_3$ layer | 0.953 | 0.040 | 1 | 0.8 |
| CoTa layer | 0.950 | 0.047 | 0.4 | 0.3 |
| Co$_3$Ta layer | 0.954 | 0.054 | 0.3 | 0.2 |
| NiTa$_3$ layer | 0.951 | 0.040 | 0.8 | 0.6 |
| NiTa layer | 0.951 | 0.049 | 0.4 | 0.3 |
| Ni$_3$Ta layer | 0.953 | 0.057 | 0.3 | 0.2 |
| TaBN layer | 0.951 | 0.033 | 0.9 | 3 |

REFERENCE SIGNS LIST

1 Substrate
2 Multilayer reflective film
3 Protective film
4 Absorber film
4a Absorber pattern
5 Conductive back film
6 Etching mask film
7 Etching stopper film
11 Resist film
11a Resist pattern
42 Lower layer
44 Upper layer
46 Lower surface region
47 Intermediate region
48 Upper surface region
100 Reflective mask blank
200 Reflective mask

The invention claimed is:
1. A reflective mask blank comprising:
a substrate;
a multilayer reflective film provided on the substrate; and
an absorber film provided on the multilayer reflective film, the absorber film comprising:
a high absorption coefficient element selected from the group consisting of cobalt (Co) and nickel (Ni), and an element that increases a dry etching rate, and wherein a lower surface region of the absorber film includes a surface of the absorber film that faces the substrate and an upper surface region of the absorber film includes a surface of the absorber film that faces away from the substrate, and wherein a concentration (atomic %) of the high absorption coefficient element in the upper surface region is higher than a concentration (atomic %) of the high absorption coefficient element in the lower surface region, and wherein the absorber film optionally includes both of Co and Ni, wherein the concentration of the high absorption coefficient element decreases monotonically from the upper surface region to the lower surface region in a depth direction of the absorber film, and wherein a concentration of the element that increases the dry etching rate increases monotonically from the upper surface region to the lower surface region in the depth direction of the absorber film.

2. The reflective mask blank according to claim 1, wherein a concentration (atomic %) of the element that increases the dry etching rate is higher in the lower surface region than in the upper surface region.

3. The reflective mask blank according to claim 1, wherein the element that increases the dry etching rate is selected from the group consisting of tantalum (Ta), tungsten (W), and tin (Sn), and wherein the absorber film optionally includes more than one of the group consisting of Ta, W, and Sn.

4. The reflective mask blank according to claim 1, wherein the absorber film is a layered film having:

a lower layer that includes the lower surface region, and
an upper layer that includes the upper surface region, and
wherein when a concentration (atomic %) of the high absorption coefficient element in the lower layer is $C1_{lower}$ and a concentration (atomic %) of the high absorption coefficient element in the upper layer is $C1_{upper}$, the following formula holds:

$$C1_{upper} > C1_{lower} \geq 0 \quad \text{(Formula 1)},$$

5. The reflective mask blank according to claim 4, wherein when a concentration (atomic %), in the lower layer of the absorber film, of the element that increases the dry etching rate is $C2_{lower}$, and a concentration (atomic %), in the upper layer of the absorber film, of the element that increases the dry etching rate is $C2_{upper}$, the following formula holds:

$$C2_{lower} > C2_{upper} \geq 0 \quad \text{(Formula 2)},$$

6. The reflective mask blank according to claim 4, wherein the upper layer of the absorber film includes cobalt (Co) and tantalum (Ta) and the lower layer of the absorber film includes tantalum (Ta).

7. The reflective mask blank according to claim 4, wherein the upper layer of the absorber film includes nickel (Ni) and tantalum (Ta) and the lower layer of the absorber film includes tantalum (Ta).

8. The reflective mask blank according to claim 4, wherein the upper layer is etchable by a dry etching gas that includes a first chlorine-based gas, and the lower layer is etchable by a dry etching gas that includes a second chlorine-based gas that is not the first chlorine-based gas.

9. The reflective mask blank according to claim 1, wherein a protective film is provided between the multilayer reflective film and the absorber film.

10. The reflective mask blank according to claim 9, wherein an etching stopper film is provided between the protective film and the absorber film, and the etching stopper film includes chromium (Cr) or silicon (Si).

11. The reflective mask blank according to claim 1, wherein an etching mask film is provided on the absorber film, and the etching mask film includes chromium (Cr) or silicon (Si).

12. A reflective mask comprising:

a substrate;
a multilayer reflective film provided on the substrate; and
an absorber film provided on the multilayer reflective film and having a patterned absorber pattern,
wherein the absorber film comprises:
a high absorption coefficient element selected from the group consisting of cobalt (Co) and nickel (Ni), and
an element that increases a dry etching rate, and
wherein a lower surface region of the absorber film includes a surface of the absorber film that faces the substrate and an upper surface region of the absorber film includes a surface of the absorber film that faces away from the substrate, and
wherein a concentration (atomic %) of the high absorption coefficient element in the upper surface region is higher than a concentration (atomic %) of the high absorption coefficient element in the lower surface region, and
wherein the absorber film optionally includes both of Co and Ni,
wherein the concentration of the high absorption coefficient element decreases monotonically from the upper surface region to the lower surface region in a depth direction of the absorber film, and
wherein a concentration of the element that increases the dry etching rate increases monotonically from the upper surface region to the lower surface region in the depth direction of the absorber film.

13. A method of manufacturing a reflective mask, the method comprising patterning the absorber film of the reflective mask blank according to claim 1, by dry etching using a chlorine-based gas, to form an absorber pattern.

14. A method of manufacturing a reflective mask, the method comprising patterning the absorber film of the reflective mask blank according to claim 1, by dry etching using a first chlorine-based gas and a second chlorine-based gas that is not the first chlorine-based gas, to form an absorber pattern.

15. A method of manufacturing a semiconductor device, the method comprising setting the reflective mask according to claim 12 in an exposure apparatus having an exposure light source that emits EUV light and transferring a transfer pattern to a resist film formed on a transfer-receiving substrate.

16. The reflective mask according to claim 12, wherein a concentration (atomic %) of the element that increases the dry etching rate is higher in the lower surface region than in the upper surface region.

17. The reflective mask according to claim 12, wherein the element that increases the dry etching rate is selected from the group consisting of tantalum (Ta), tungsten (W), and tin (Sn), and wherein the absorber film optionally includes more than one of the group consisting of Ta, W, and Sn.

18. The reflective mask according to claim 12, wherein the absorber film is a layered film having:

a lower layer that includes the lower surface region, and
an upper layer that includes the upper surface region, and wherein when a concentration (atomic %) of the high absorption coefficient element in the lower layer is $C1_{lower}$ and a concentration (atomic %) of the high absorption coefficient element in the upper layer is $C1_{upper}$, the following formula holds:

$$C1_{upper} > C1_{lower} \geq 0 \quad \text{(Formula 1)}.$$

19. The reflective mask according to claim 18, wherein when a concentration (atomic %), in the lower layer of the absorber film, of the element that increases the dry etching rate is $C2_{lower}$, and a concentration (atomic %), in the upper layer of the absorber film, of the element that increases the dry etching rate is $C2_{upper}$, the following formula holds:

$$C2_{lower} > C2_{upper} \geq 0 \quad \text{(Formula 2)}.$$

20. The reflective mask according to claim 18, wherein the upper layer of the absorber film includes cobalt (Co) and tantalum (Ta) and the lower layer of the absorber film includes tantalum (Ta).

21. The reflective mask according to claim 18, wherein the upper layer of the absorber film includes nickel (Ni) and tantalum (Ta) and the lower layer of the absorber film includes tantalum (Ta).

22. The reflective mask according to claim 18, wherein the upper layer is etchable by a dry etching gas that includes a first chlorine-based gas, and the lower layer is etchable by a dry etching gas that includes a second chlorine-based gas that is not the first chlorine-based gas.

23. The reflective mask according to claim 12, wherein a protective film is provided between the multilayer reflective film and the absorber film.

24. The reflective mask according to claim 23, wherein an etching stopper film is provided between the protective film and the absorber film, and the etching stopper film includes chromium (Cr) or silicon (Si).

25. The reflective mask according to claim 12, wherein an etching mask film is provided on the absorber film, and the etching mask film includes chromium (Cr) or silicon (Si).

* * * * *